United States Patent
Liao

(10) Patent No.: US 11,063,050 B2
(45) Date of Patent: Jul. 13, 2021

(54) SEMICONDUCTOR DEVICE WITH AIR GAPS AND METHOD FOR FABRICATING THE SAME

(71) Applicant: NANYA TECHNOLOGY CORPORATION, New Taipei (TW)

(72) Inventor: Chun-Cheng Liao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 36 days.

(21) Appl. No.: 16/582,289

(22) Filed: Sep. 25, 2019

(65) Prior Publication Data

US 2021/0091087 A1    Mar. 25, 2021

(51) Int. Cl.
*H01L 27/108* (2006.01)
*H01L 21/768* (2006.01)

(52) U.S. Cl.
CPC .... *H01L 27/10855* (2013.01); *H01L 21/7682* (2013.01); *H01L 21/7687* (2013.01); *H01L 27/10814* (2013.01); *H01L 27/10823* (2013.01); *H01L 27/10876* (2013.01)

(58) Field of Classification Search
CPC ......... H01L 27/10855; H01L 27/10814; H01L 27/10823; H01L 27/10876
See application file for complete search history.

(56) References Cited

U.S. PATENT DOCUMENTS

| | | | | |
|---|---|---|---|---|
| 9,356,073 | B1 * | 5/2016 | Kim | H01L 21/76805 |
| 2013/0292847 | A1 * | 11/2013 | Choi | H01L 21/76897 257/774 |
| 2015/0126013 | A1 * | 5/2015 | Hwang | H01L 23/5226 438/381 |
| 2018/0301457 | A1 * | 10/2018 | Lee | H01L 28/75 |

FOREIGN PATENT DOCUMENTS

TW              201921639 A      6/2019

* cited by examiner

*Primary Examiner* — Phuc T Dang
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a plurality of plugs positioned above the substrate, a plurality of air gaps positioned adjacent to the plurality of plugs, and a plurality of capacitor structures positioned above the substrate.

16 Claims, 38 Drawing Sheets

SEMICONDUCTOR DEVICE WITH AIR GAPS AND METHOD FOR FABRICATING THE SAME

TECHNICAL FIELD

The present disclosure relates to a semiconductor device and a method for fabricating the semiconductor device, and more particularly, to a semiconductor device with air gaps and a method for fabricating the semiconductor device with air gaps.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved quality, yield, performance, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a plurality of plugs positioned above the substrate, a plurality of air gaps positioned adjacent to the plurality of plugs, and a plurality of capacitor structures positioned above the substrate.

In some embodiments, the semiconductor device further comprises a plurality of holding structures positioned adjacent to the plurality of plugs.

In some embodiments, the plurality of air gaps are positioned above the plurality of holding structures.

In some embodiments, the plurality of holding structures comprise a plurality of top holding structures positioned below the plurality of air gaps, a plurality of middle holding structures positioned below the plurality of top holding structures, and a plurality of bottom holding structures positioned below the plurality of middle holding structures.

In some embodiments, the semiconductor device further comprises a plurality of word lines, wherein the plurality of word lines extend along a first direction.

In some embodiments, adjacent pairs of the plurality of middle holding structures are joined to each other along the first direction.

In some embodiments, the semiconductor device further comprises a plurality of spacers positioned between the plurality of air gaps and the plurality of plugs.

In some embodiments, the plurality of word lines comprise a plurality of word line insulating layers inwardly positioned in the substrate, a plurality of word line electrodes positioned on the plurality of word line insulating layers, and a plurality of word line capping layers positioned on the plurality of word line electrodes.

In some embodiments, the semiconductor device further comprises a plurality of bit lines positioned above the substrate and extending along a second direction, wherein the second direction is perpendicular to the first direction.

In some embodiments, the plurality of bit lines are formed as undulating strips.

In some embodiments, the semiconductor device further comprises a plurality of bit line contacts positioned below the plurality of bit lines.

In some embodiments, the plurality of capacitor structures comprise a plurality of capacitor bottom electrodes inwardly positioned above the plurality of plugs, a capacitor insulating layer positioned on the plurality of capacitor bottom electrodes, and a capacitor top electrode positioned on the capacitor insulating layer.

Another aspect of the present disclosure provides a method for fabricating a semiconductor device including providing a substrate, forming a plurality of plugs above the substrate, forming a plurality of air gaps adjacent to the plurality of plugs, and forming a plurality of capacitor structures above the substrate.

In some embodiments, the method for fabricating a semiconductor device further comprises: forming a plurality of holding structures positioned adjacent to the plurality of plugs.

In some embodiments, the plurality of air gaps are positioned above the plurality of holding structures.

In some embodiments, the plurality of holding structures comprise a plurality of top holding structures positioned below the plurality of air gaps, a plurality of middle holding structures positioned below the plurality of top holding structures, and a plurality of bottom holding structures positioned below the plurality of middle holding structures.

In some embodiments, the method for fabricating a semiconductor device further comprises: forming a plurality of word lines positioned above the substrate, wherein the plurality of word lines extend along a first direction.

In some embodiments, adjacent pairs of the plurality of middle holding structures are joined to each other along the first direction.

In some embodiments, the method for fabricating a semiconductor device further comprises: a plurality of spacers positioned between the plurality of air gaps and the plurality of plugs.

In some embodiments, the plurality of word lines comprise a plurality of word line insulating layers inwardly positioned in the substrate, a plurality of word line electrodes positioned on the plurality of word line insulating layers, and a plurality of word line capping layers positioned on the plurality of word line electrodes.

Due to the design of the semiconductor device of the present disclosure, the parasitic capacitance of the semiconductor may be reduced; therefore, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
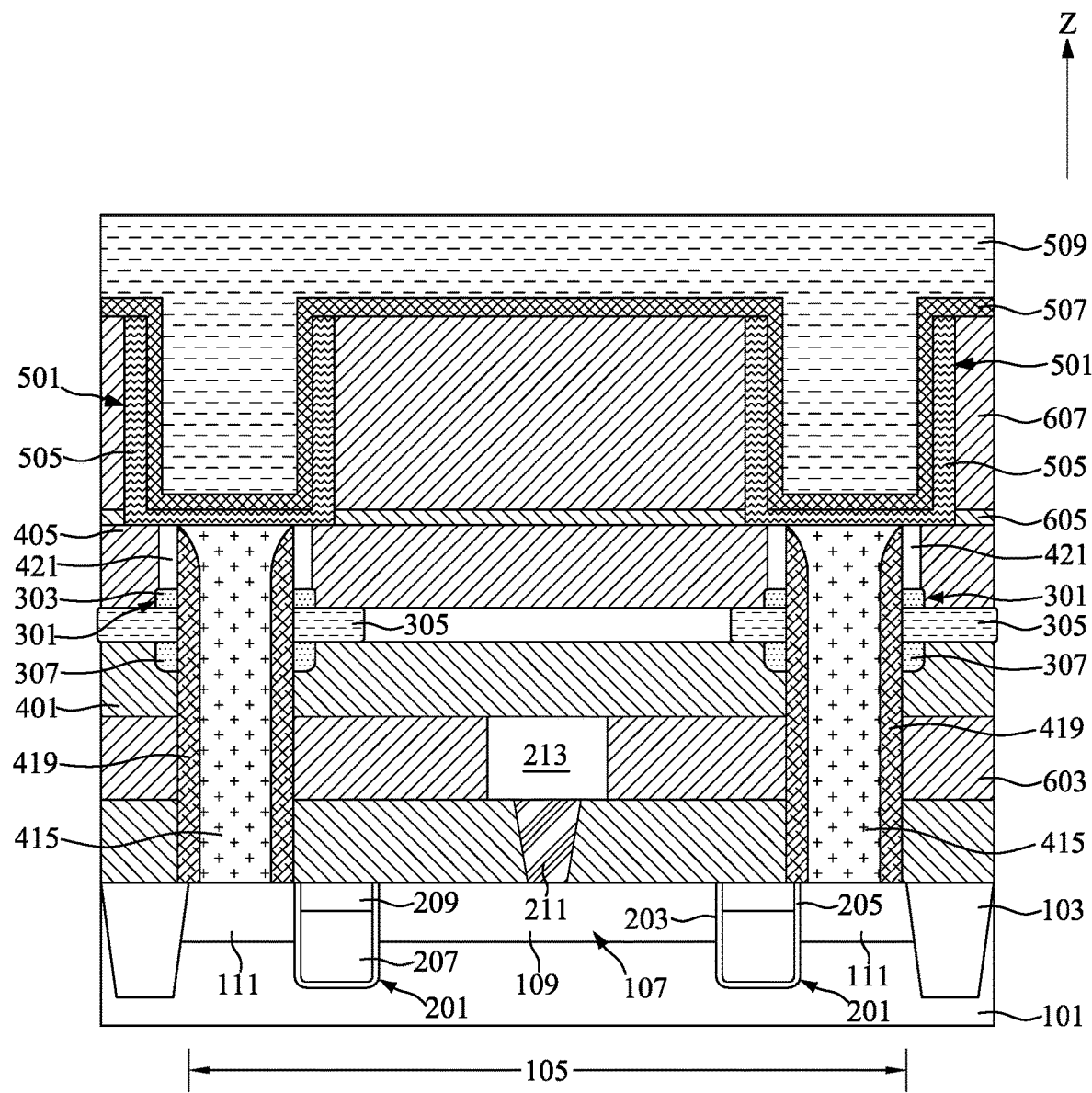
FIGS. 1 and 2 illustrate, in schematic cross-sectional view diagrams, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

It should be noted that, in the description of the present disclosure, above (or up) corresponds to the direction of the arrow of the direction Z, and below (or down) corresponds to the opposite direction of the arrow of the direction Z.

Figure 2:
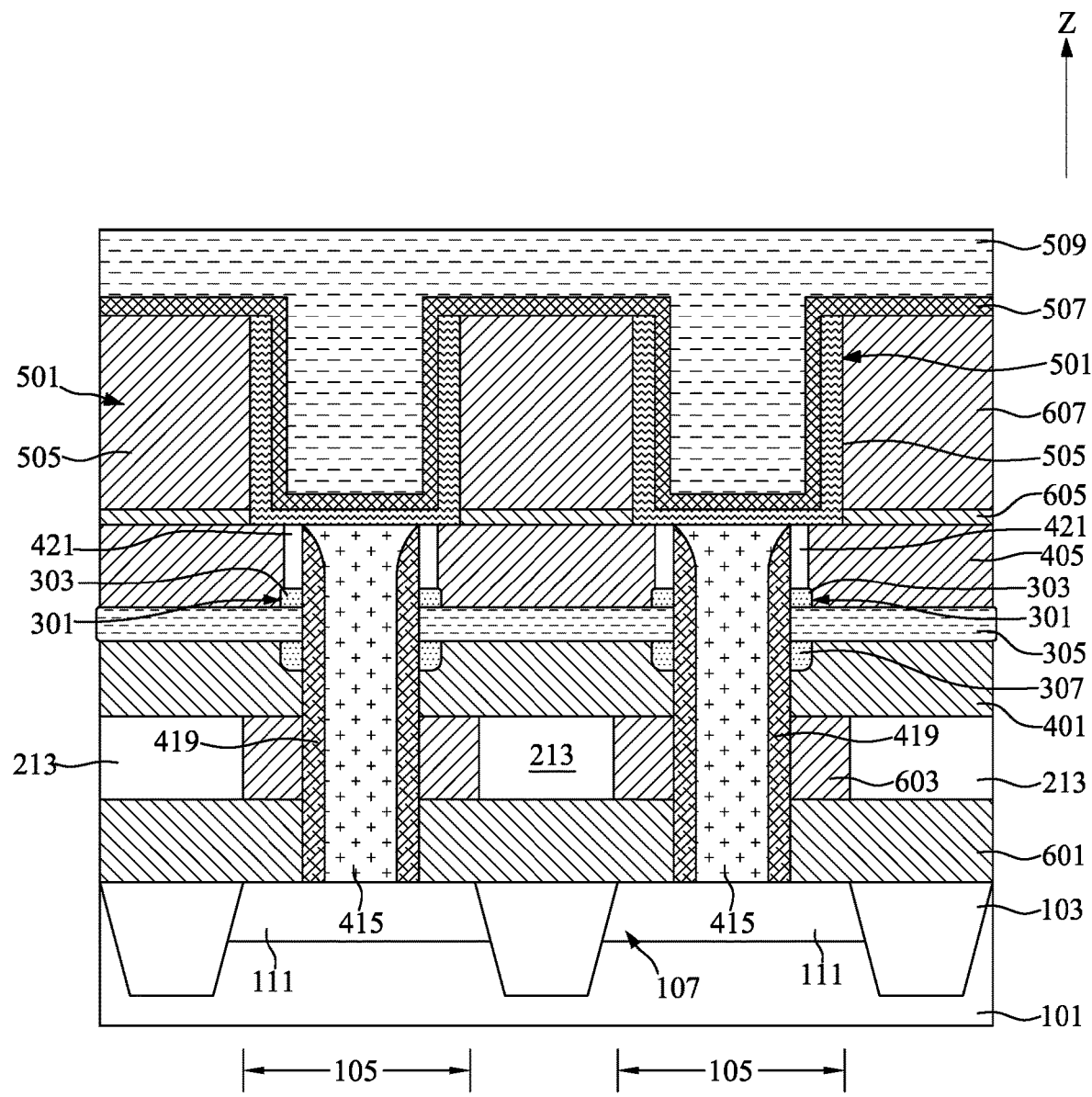
Figure 3:
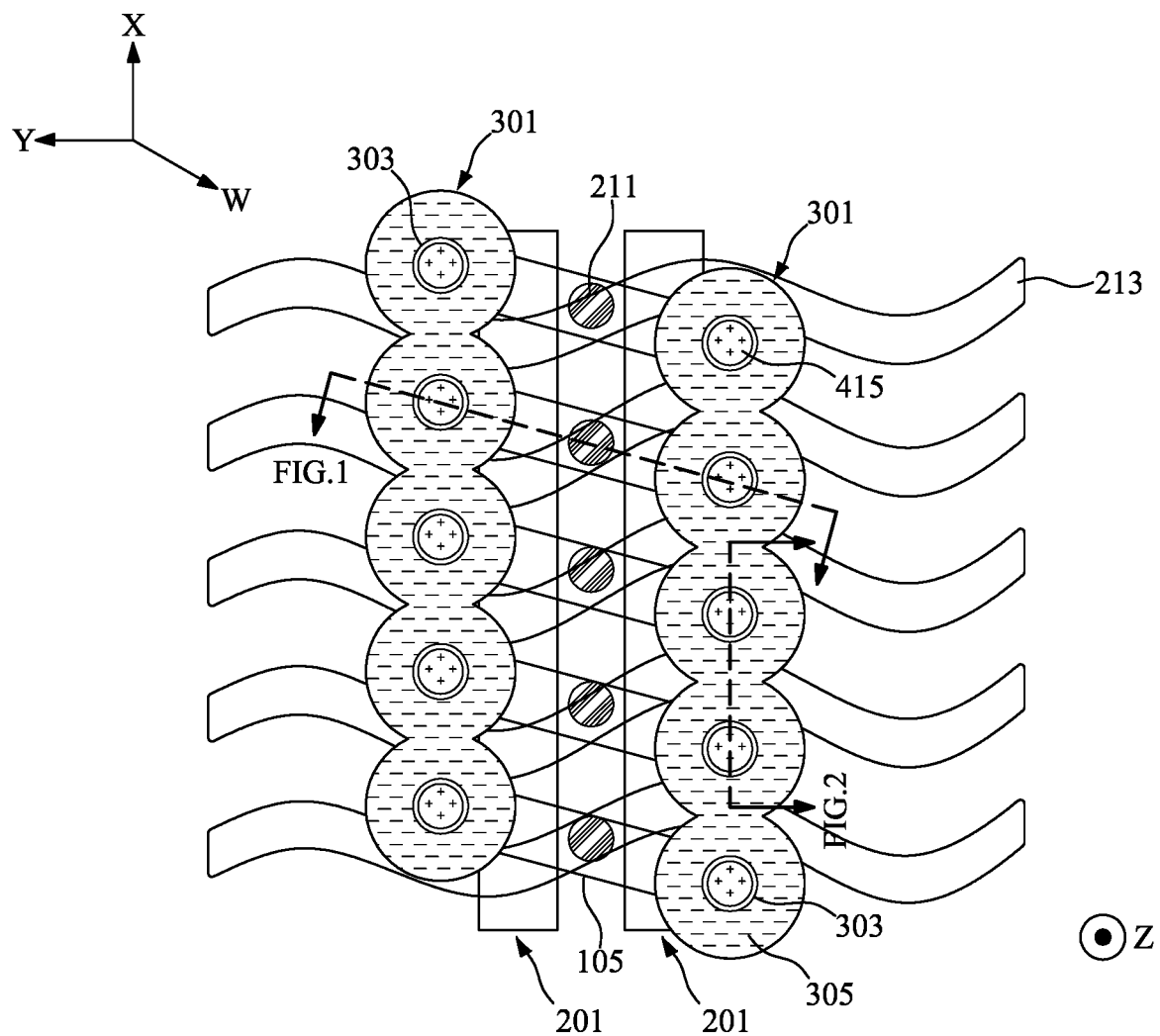
FIG. 3 illustrates, in a schematic top-view diagram, the semiconductor device in accordance with FIGS. 1 and 2.

FIGS. 1 and 2 illustrate, in schematic cross-sectional view diagrams, a semiconductor device in accordance with one embodiment of the present disclosure. FIG. 3 illustrates, in a schematic top-view diagram, the semiconductor device in accordance with FIGS. 1 and 2. Some elements of the semiconductor device of the present disclosure are not shown in FIG. 3 for clarity.

With reference to FIGS. 1 to 3, a semiconductor device may include a substrate 101, an isolation structure 103, a plurality of doped regions 107, a plurality of word lines 201, a plurality of bit line contacts 211, a plurality of bit lines 213, a plurality of holding structures 301, a bottom insulating film 401, a middle insulating film 403, a top insulating film 405, a plurality of plugs 415, a plurality of spacers 419, a plurality of air gaps 421, a plurality of capacitor structures 501, a first insulating film 601, a second insulating film 603, a sealing layer 605, and a third insulating film 607.

With reference to FIGS. 1 to 3, in the embodiment depicted, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. Alternatively, in another embodiment, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer and the bottom semiconductor layer. The buried insulating layer may include, for example, a crystalline or non-crystalline oxide, nitride or any combination thereof.

With reference to FIGS. 1 to 3, in the embodiment depicted, the isolation layer 103 may be disposed in the substrate 101. Specifically, the isolation layer 103 may be disposed in an upper portion of the substrate 101. The isolation layer 103 may be formed of, for example, an insulating material such as silicon oxide, silicon nitride, silicon oxynitride, silicon nitride oxide, or fluoride-doped silicate. The isolation layer 103 may define a plurality of active regions 105 of the substrate 101. The plurality of active regions 105 may extend along a direction W.

Note that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 3, in the embodiment depicted, the plurality of doped regions 107 may be disposed in the upper portion of the substrate 101. Specifically, the plurality of doped regions 107 may be disposed in the plurality of active regions 105 of the substrate 101. The plurality of doped regions 107 may be doped with a dopant such as phosphorus, arsenic, or antimony.

With reference to FIGS. 1 to 3, in the embodiment depicted, the plurality of word lines 201 may be disposed in the substrate 101. Specifically, the plurality of word lines 201 may extend along a direction X and be separated from each other. The direction W may be diagonal with respect to the direction X. The plurality of word lines 201 may intersect the plurality of active regions 105. Each of the plurality of active regions 105 may intersect two of the plurality of word lines 201. Each of the plurality of doped regions 107 disposed in the plurality of active regions 105 may be divided by the two of the plurality of word lines 201 into a first doped region 109 and second doped regions 111. The first doped region 109 may be disposed between the two of the plurality of word lines 201. The second doped regions 111 may be respectively disposed at two ends of the each of the plurality of active regions 105, in other words, the second doped regions 111 may be respectively correspondingly opposite to the first doped region 109 with the two of the plurality of word lines 201 interposed therebetween.

With reference to FIGS. 1 to 3, in the embodiment depicted, the plurality of word lines 201 may include a plurality of word line insulating layers 205, a plurality of word line electrodes 207, and a plurality of word line capping layers 209. The plurality of word line insulating layers 205 may be inwardly disposed in the upper portion of the substrate 101. A thickness of the plurality of word line insulating layers 205 may be between about 0.5 nm and about 10 nm. Bottoms of the plurality of word line insulating layers 205 may be flat. The plurality of word line insulating layers 205 may be formed of an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like.

With reference to FIGS. 1 to 3, in the embodiment depicted, the plurality of word line electrodes 207 may be respectively correspondingly disposed on the plurality of word line insulating layers 205. The plurality of word line electrodes 207 may be formed of a conductive material such as polysilicon, silicon germanium, metal, metal alloy, metal silicide, metal nitride, metal carbide, or a combination including multilayers thereof. When multilayers are present, a diffusion barrier layer (not shown) such as titanium nitride or tantalum nitride may be disposed between each of the multilayers. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. Thicknesses of the plurality of word line electrodes 207 may be between about 50 nm and about 500 nm.

With reference to FIGS. 1 to 3, in the embodiment depicted, the plurality of word line capping layers 209 may be respectively correspondingly disposed on the plurality of word line electrodes 207. Top surfaces of the plurality of word line capping layers 209 may be even with a top surface of the substrate 101. The plurality of word line capping layers 209 may be formed of a single layer including an insulating material having a dielectric constant of about 4.0 or greater. Alternatively, in another embodiment, each of the plurality of word line capping layers 209 may be formed of stacked layers including a bottom capping layer disposed on the word line electrode 207 and a top capping layer disposed on the bottom capping layer. The bottom capping layer may be formed of an insulating material having a dielectric constant of about 4.0 or greater. A top surface of the top capping layer may be at the same vertical level as the top surface of the substrate 101. The top capping layer may be formed of a low dielectric-constant material such as silicon oxide, silicon nitride, silicon oxynitride, silicon nitride oxide, fluoride-doped silicate, or the like. The top capping layer formed of the low dielectric-constant material may reduce electric field at the top surface of the substrate 101; therefore, leakage current may be reduced.

With reference to FIGS. 1 to 3, in the embodiment depicted, the first insulating film 601 may be disposed on the substrate 101. The first insulating film 601 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIGS. 1 to 3, in the embodiment depicted, the plurality of bit line contacts 211 may be disposed above the substrate 101. Specifically, the plurality of bit line contacts 211 may be disposed in the first insulating film 601 and respectively correspondingly on the plurality of first doped regions 109. That is, the plurality of bit line contacts 211 may be respectively correspondingly disposed on middle portions of the plurality of active regions 105. The plurality of bit line contacts 211 may be formed of a conductive material such as doped polysilicon, metal, metal nitride, or metal silicide. The plurality of bit line contacts 211 may be electrically connected to the plurality of first doped regions 109.

With reference to FIGS. 1 to 3, in the embodiment depicted, the second insulating film 603 may be disposed on the first insulating film 601. The second insulating film 603 may be formed of the same material as the first insulating film 601, but is not limited thereto.

With reference to FIGS. 1 to 3, in the embodiment depicted, the plurality of bit lines 213 may be disposed above the substrate 101. Specifically, the plurality of bit lines 213 may be disposed in the second insulating film 603 and on the plurality of bit line contacts 211. The plurality of bit lines 213 may extend along a direction Y and implemented as undulating strips as viewed from above. The direction Y may be perpendicular to the direction X. The direction W may be diagonal with respect to the direction X and the direction Y. The plurality of bit lines 213 may respectively correspondingly intersect the plurality of active regions 105. Each of the plurality of active regions 105 may intersect one of the plurality of bit lines 213. The plurality of bit line contacts 211 may be respectively correspondingly disposed below intersections of the plurality of active regions 105 and the plurality of bit lines 213. The plurality of bit lines 213 may be formed of a conductive material such as tungsten, aluminum, copper, nickel, or cobalt. The plurality of bit lines 213 may be electrically connected to the plurality of bit line contacts 211 and electrically coupled to the plurality of first doped regions 109.

With reference to FIGS. 1 to 3, in the embodiment depicted, the bottom insulating film 401 may be disposed on the second insulating film 603. The middle insulating film 403 may be disposed on the bottom insulating film 401. The top insulating film 405 may be disposed on the middle insulating film 403. The bottom insulating film 401 and the top insulating film 405 may be formed of a first material. The middle insulating film 403 may be formed of a second material. A density of the first material may be greater than that of the second material. The first material may include polysilicon and the second material may include doped polysilicon. Alternatively, in another embodiment, the first material and the second material may include oxidizable material. Alternatively, in another embodiment, the first material may include undoped oxidizable material or doped oxidizable material. The second material may include doped material or doped oxidizable material. Alternatively, in another embodiment, the first material may be undoped oxide. A ratio of a thickness of the top insulating film 405 to a thickness of the middle insulating film 403 may be between 5:1 and 1:1.

With reference to FIGS. 1 to 3, in the embodiment depicted, the plurality of plugs 415 may be disposed above the substrate 101. Specifically, the plurality of plugs 415 may be respectively correspondingly disposed on the plurality of second doped regions 111 and may penetrate through the top insulating film 405, the middle insulating film 403, the bottom insulating film 401, the second insulating film 603, and the first insulating film 601. That is, the plurality of plugs 415 may be respectively correspondingly disposed on the two ends of each of the plurality of active regions 105. The plurality of plugs 415 may be formed of doped polysilicon, titanium, titanium nitride, tantalum, tantalum nitride, tungsten, copper, aluminum or aluminum alloy. The plurality of plugs 415 may be electrically connected to the plurality of second doped regions 111.

With reference to FIGS. 1 to 3, in the embodiment depicted, the plurality of spacers 419 may be disposed above the substrate 101. Specifically, the plurality of spacers 419 may be respectively correspondingly disposed on sidewalls of the plurality of plugs 415 and surrounded by the top insulating film 405, the middle insulating film 403, the bottom insulating film 401, the second insulating film 603, and the first insulating film 601. The plurality of spacers 419 may be formed of, for example, silicon oxide, silicon nitride, silicon oxynitride, or silicon nitride oxide.

With reference to FIGS. 1 to 3, in the embodiment depicted, the plurality of holding structures 301 may be disposed above the substrate 101. The plurality of holding structures 301 may be respectively correspondingly disposed adjacent to upper portions of the plurality of plugs 415 with the plurality of spacers 419 interposed therebetween. Specifically, the plurality of holding structures 301 may be respectively correspondingly disposed so as to surround the upper portions of the plurality of plugs 415. That is, the plurality of holding structures 301 may be respectively correspondingly disposed on and attached to outer surfaces of the plurality of spacers 419. The plurality of holding structures 301 may include a plurality of top holding structures 303, a plurality of middle holding structures 305, and a plurality of bottom holding structures 307.

With reference to FIGS. 1 to 3, in the embodiment depicted, the plurality of top holding structures 303 may be disposed in the top insulating film 405 and respectively correspondingly disposed so as to surround the upper portions of the plurality of plugs 415. In other words, the plurality of top holding structures 303 may be respectively correspondingly opposite to the plurality of plugs 415 with the plurality of spacers 419 interposed therebetween. The plurality of top holding structures 303 may be formed of a material oxidized from the first material.

With reference to FIGS. 1 to 3, in the embodiment depicted, the plurality of middle holding structures 305 may be disposed in the middle insulating film 403 and below the plurality of top holding structures 303. The plurality of middle holding structures 305 may be respectively correspondingly disposed so as to surround the upper portions of the plurality of plugs 415. Adjacent pairs of the plurality of middle holding structures 305 along the direction X may be joined together. The plurality of joined middle holding structures 305 may provide additional support to the plurality of plugs 415 and the plurality of spacers 419. Adjacent pairs of the plurality of middle holding structures 305 along the direction W may be separated from each other with the middle insulating film 403 interposed therebetween. The plurality of middle holding structures 305 may be formed of a material oxidized from the second material. A ratio of a height of the plurality of plugs 415 to a thickness of the plurality of middle holding structures 305 may be between 10:1 and 4:1.

With reference to FIGS. 1 to 3, in the embodiment depicted, the plurality of bottom holding structures 307 may be disposed in the bottom insulating film 401 and below the plurality of middle holding structures 305. The plurality of bottom holding structures 307 may be respectively correspondingly disposed so as to surround the upper portions of the plurality of plugs 415. In other words, the plurality of bottom holding structures 307 may be respectively correspondingly opposite to the plurality of plugs 415 with the plurality of spacers 419 interposed therebetween. The plurality of bottom holding structures 307 may be opposite to the plurality of top holding structures 303 with the plurality of middle holding structures 305 interposed therebetween. The plurality of bottom holding structures 307 may be formed of a material oxidized from the first material. The plurality of holding structures 301 may provide additional mechanical strength to support the plurality of plugs 415 and the plurality of spacers 419; therefore, the structural stability of the semiconductor device may be improved.

With reference to FIGS. 1 to 3, in the embodiment depicted, the plurality of air gaps 421 may be disposed in the top insulating film 405 and respectively correspondingly disposed above the plurality of top holding structures 303. The plurality of air gaps 421 may be respectively correspondingly disposed adjacent to the upper portions of the plurality of plugs 415 with the plurality of spacers 419 interposed therebetween. Specifically, the plurality of air gaps 421 may be respectively correspondingly disposed adjacent to upper portions of the outer surfaces of the plurality of spacers 419. The plurality of air gaps 421 may be air-filled spaces surrounded by the plurality of spacers 419, the top insulating film 405, and the plurality of capacitor structures 501, as described below. The plurality of air gaps 421 may have a dielectric constant significantly lower than that of the films formed of, for example, silicon oxide. Therefore, the plurality of air gaps 421 may significantly reduce the parasitic capacitance between the plurality of plugs 415. That is, the plurality of air gaps 421 may significantly alleviate an interference between electrical signals induced by or affecting the plurality of plugs 415. As a result, a performance of the semiconductor device may be improved. In addition, the plurality of air gaps 421 are only disposed adjacent to the upper portion of the plurality of plugs 415, and therefore do not affect the structural stability of the plurality of plugs 415.

The sealing layer 605 may be disposed on the top insulating film 405. The sealing layer 605 may be formed of, for example, an insulating material such as silicon oxide, silicon nitride, spin-on glass, silicon oxynitride, silicon nitride oxide, or the like. A thickness of the sealing layer 605 may be between about 1000 angstroms and about 5000 angstroms. The thickness of the sealing layer 605 may be set to an arbitrary range depending on the circumstances.

With reference to FIGS. 1 to 3, in the embodiment depicted, the third insulating film 607 may be disposed on the sealing layer 605. The third insulating film 607 may be formed of the same material as the first insulating film 601, but is not limited thereto.

With reference to FIGS. 1 to 3, in the embodiment depicted, the plurality of capacitor structures 501 may be disposed above the substrate 101. Specifically, the plurality of capacitor structures 501 may be disposed in the sealing layer 605 and the third insulating film 607. The plurality of capacitor structures 501 may be respectively correspondingly disposed on the plurality of plugs 415 and electrically connected to the plurality of plugs 415. The plurality of capacitor structures 501 may include a plurality of capacitor bottom electrodes 505, a capacitor insulating layer 507, and a capacitor top electrode 509.

With reference to FIGS. 1 to 3, in the embodiment depicted, the plurality of capacitor bottom electrodes 505 may be inwardly disposed in the third insulating film 607 and the sealing layer 605. The plurality of capacitor bottom electrodes 505 may be respectively correspondingly disposed on the plurality of plugs 415. Bottoms of the plurality of capacitor bottom electrodes 505 may respectively correspondingly cover top surfaces of the plurality of plugs 415 and the plurality of air gaps 421. Each of the plurality of capacitor bottom electrodes 505 may be U-shaped. The plurality of capacitor bottom electrodes 505 may be formed of doped polysilicon, metal, or metal silicide.

With reference to FIGS. 1 to 3, in the embodiment depicted, the capacitor insulating layer 507 may be respectively correspondingly disposed on the plurality of capacitor bottom electrodes 505 and covering top surfaces of the third insulating film 607. The capacitor insulating layer 507 may be formed of a single layer including an insulating material having a dielectric constant of about 4.0 or greater. A thickness of the capacitor insulating layer 507 may be between about 1 angstrom and about 100 angstroms. Alternatively, in another embodiment, the capacitor insulating layer 507 may be formed of a stacked layer consisting of silicon oxide, silicon nitride, and silicon oxide. In such embodiments, the capacitor top electrode 509 may be disposed on the capacitor insulating layer 507. Alternatively, the capacitor insulating layer 507 may be formed of doped polysilicon or metal.

Figure 4:
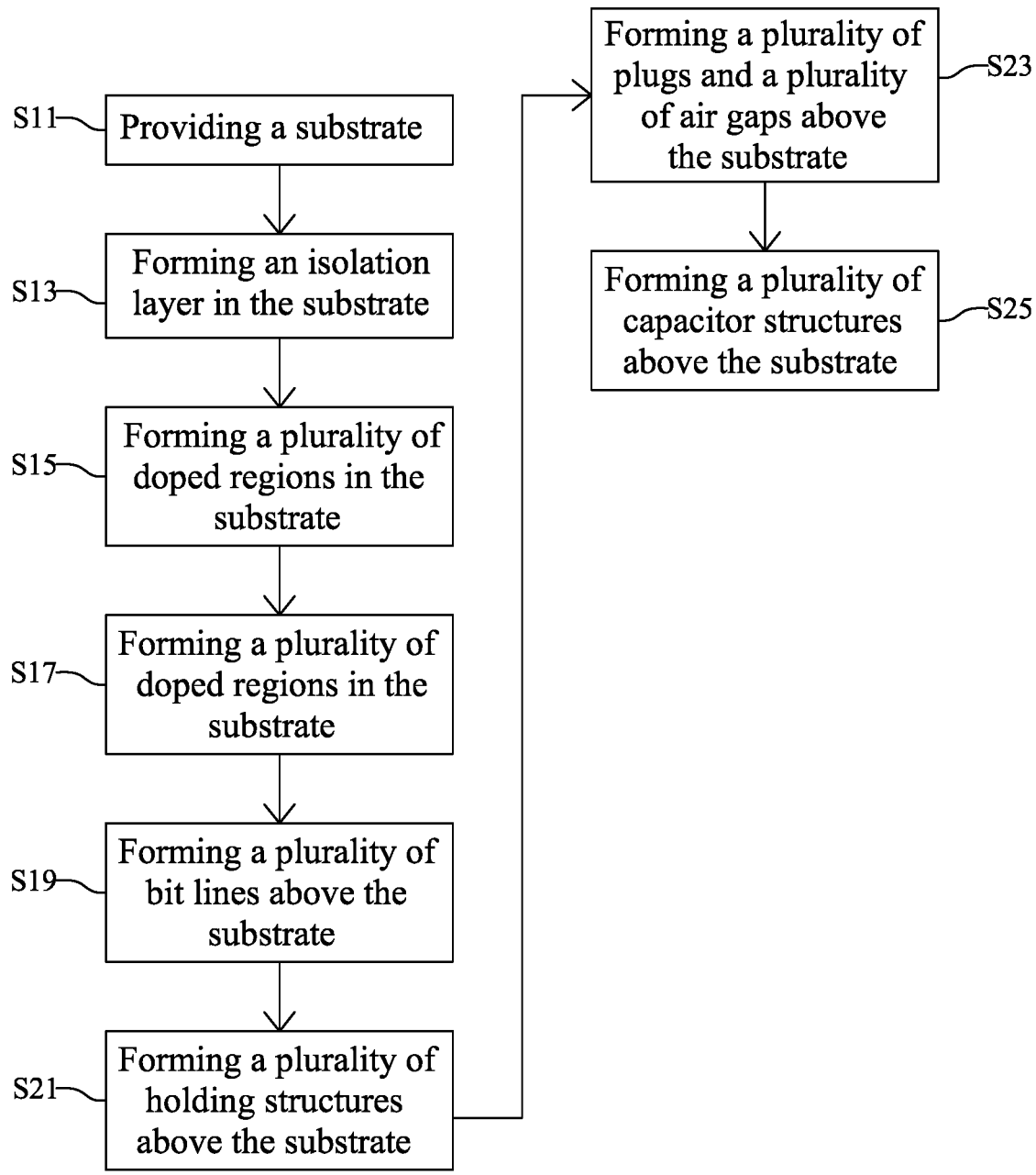
FIG. 4 illustrates, in a flowchart diagram form, a method 10 for fabricating a semiconductor device in accordance with one embodiment of the present disclosure.
Figure 5:
FIGS. 5 and 6 illustrate, in schematic cross-sectional diagrams, part of a flow of fabricating a semiconductor device in accordance with one embodiment of the present disclosure.
Figure 6:
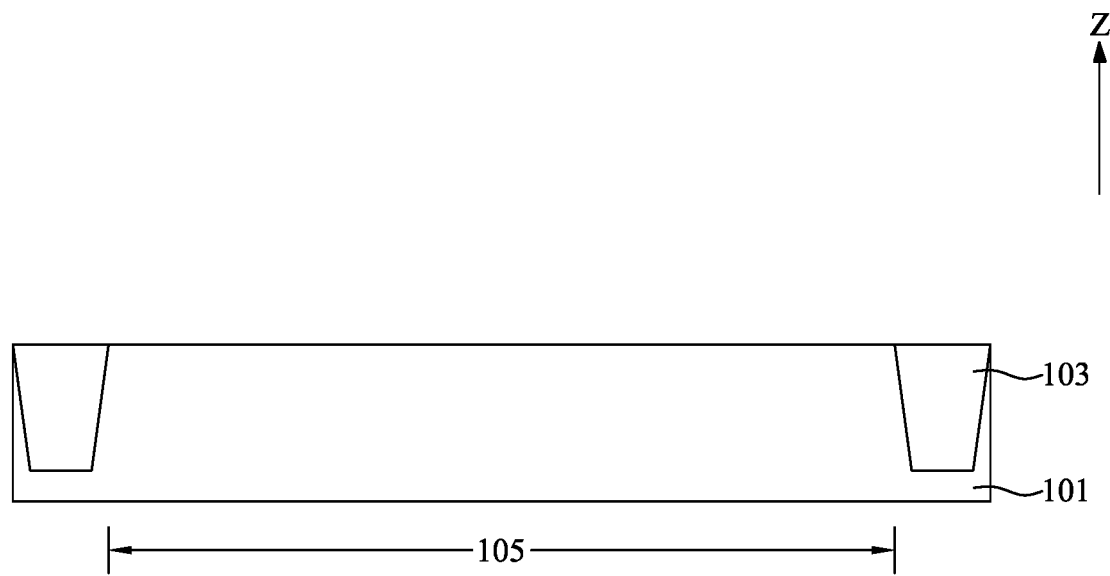
Figure 7:
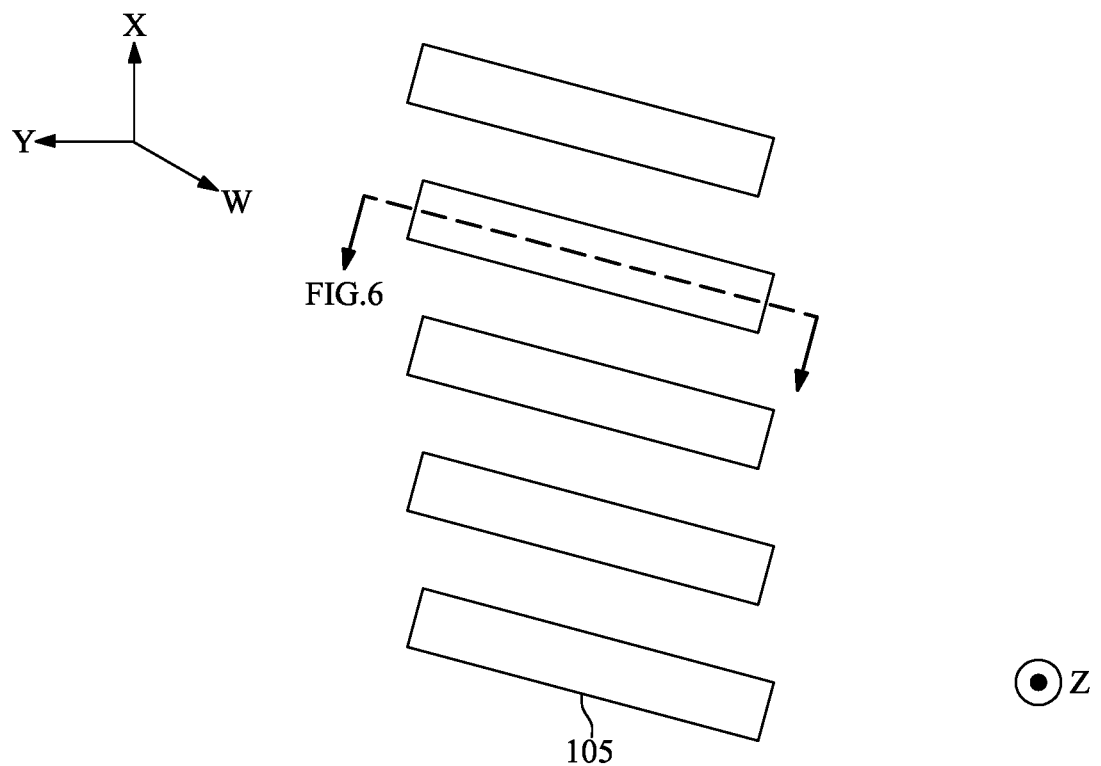
FIG. 7 illustrates, in a schematic top-view diagram, the semiconductor device in accordance with FIG. 6.

FIG. 4 illustrates, in a flowchart diagram form, a method 10 for fabricating a semiconductor device in accordance with one embodiment of the present disclosure. FIGS. 5 and 6 illustrate, in schematic cross-sectional diagrams, part of a flow of fabricating a semiconductor device in accordance with one embodiment of the present disclosure. FIG. 7 illustrates, in a schematic top-view diagram, the semiconductor device in accordance with FIG. 6. Some elements of the semiconductor device of the present disclosure are not shown in FIG. 7 for clarity.

With reference to FIGS. 4 and 5, at step S1, in the embodiment depicted, a substrate 101 may be provided.

With reference to FIG. 4 and FIGS. 6 to 7, at step S13, in the embodiment depicted, an isolation layer 103 may be formed in an upper portion of the substrate 101. A photolithography process may be performed to define a position of the isolation layer 103 in the substrate 101. After the photolithography process, an etch process, such as an anisotropic dry etch process, may be performed to form a plurality of trenches in the upper portions of the substrate 101. An insulating material such as silicon oxide, silicon nitride, silicon oxynitride, silicon nitride oxide, or fluoride-doped silicate may be deposited into the plurality of trenches by a deposition process. After the deposition process, a planarization process, such as chemical mechanical polishing, may be performed to remove excess filling material, provide a substantially flat surface for subsequent processing steps, and conformally form the isolation layer 103. The isolation layer 103 may define a plurality of active regions 105 of the substrate 101. The plurality of active regions 105 may extend along a direction W.

Figure 8:
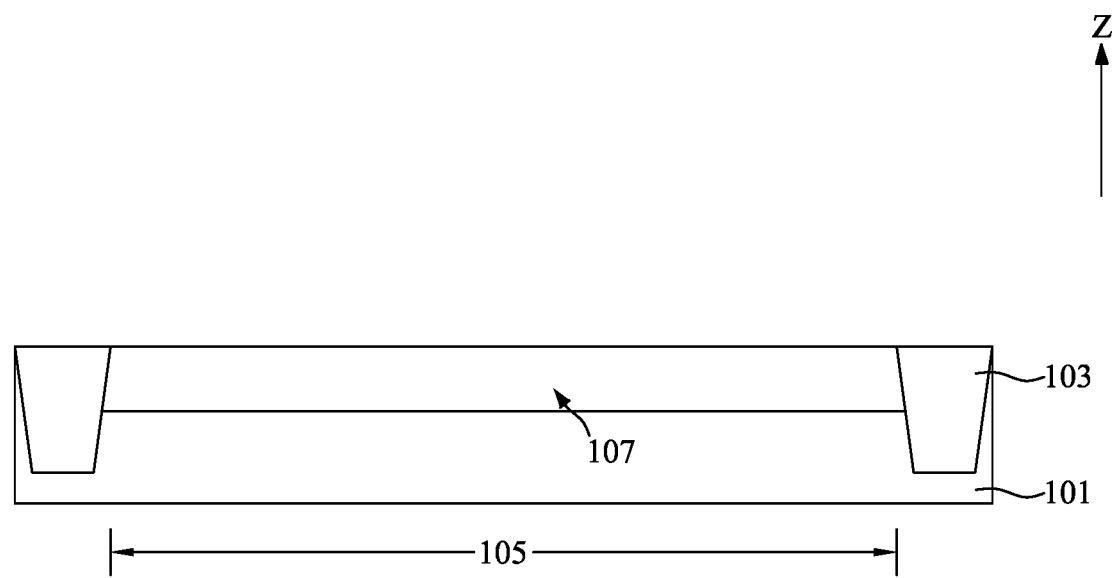
FIG. 8 illustrates, in a schematic cross-sectional diagram, part of the flow of fabricating a semiconductor device in accordance with one embodiment of the present disclosure.

FIG. 8 illustrates, in a schematic cross-sectional diagram, part of the flow of fabricating a semiconductor device in accordance with one embodiment of the present disclosure.

With reference to FIGS. 4 and 8, at step S15, in the embodiment depicted, a plurality of doped regions 107 may be formed in the plurality of active regions 105 of the substrate 101 by an implantation process using dopant such as phosphorus, arsenic, or antimony.

FIGS. 9 to 12 illustrate, in schematic cross-sectional diagrams, part of the flow of fabricating a semiconductor device in accordance with one embodiment of the present disclosure. FIG. 13 illustrates, in a schematic top-view diagram, the semiconductor device in accordance with FIG. 12. Some elements of the semiconductor device of the present disclosure are not shown in FIG. 13 for clarity.

Figure 9:
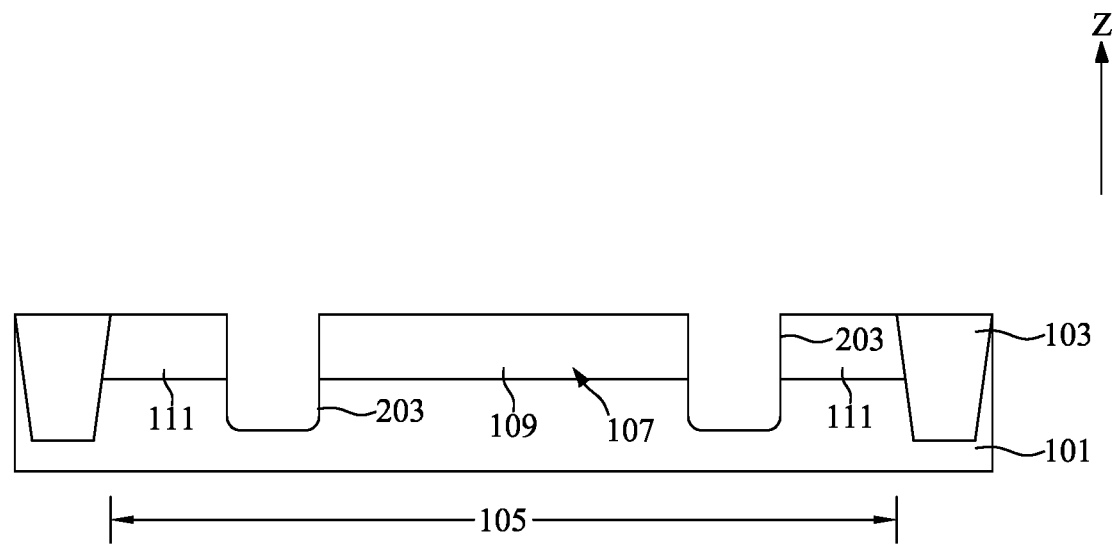
FIGS. 9 to 12 illustrate, in schematic cross-sectional diagrams, part of the flow of fabricating a semiconductor device in accordance with one embodiment of the present disclosure.

With reference to FIG. 4 and FIGS. 9 to 13, at step S17, in the embodiment depicted, a plurality of word lines 201 may be formed in the substrate 101. With reference to FIG. 9, in the embodiment depicted, a photolithography process may be performed to define positions of the plurality of word lines 201 in the substrate 101. After the photolithography process, an etch process, such as an anisotropic dry etch process, may be performed to form a plurality of word line recesses 203 in the upper portions of the substrate 101. The plurality of word line recesses 203 may extend along a direction X and be separated from each other. The direction W may be diagonal with respect to the direction X. The plurality of word line recesses 203 may intersect the plurality of active regions 105. Each of the plurality of active regions 105 may intersect two of the plurality of word line recesses 203. Each of the plurality of doped regions 107 disposed in the plurality of active regions 105 may be divided by the two of the plurality of word line recesses 203 into a first doped region 109 and second doped regions 111. The first doped region 109 may be disposed between the two of the plurality of word line recesses 203. The second doped regions 111 may be respectively disposed in two ends of each of the plurality of active regions 105.

Figure 10:
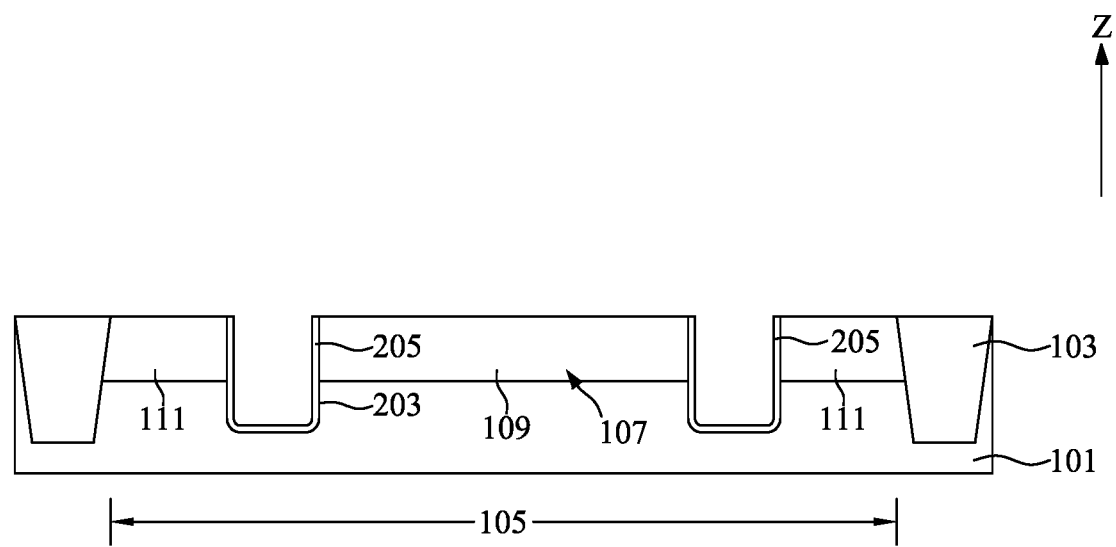

With reference to FIG. 10, in the embodiment depicted, a plurality of word line insulating layers 205 may be respectively correspondingly formed in the plurality of word line recesses 203 by a deposition process. A planarization process, such as chemical mechanical polishing, may be performed to provide a substantially flat surface for subsequent processing steps.

Figure 11:
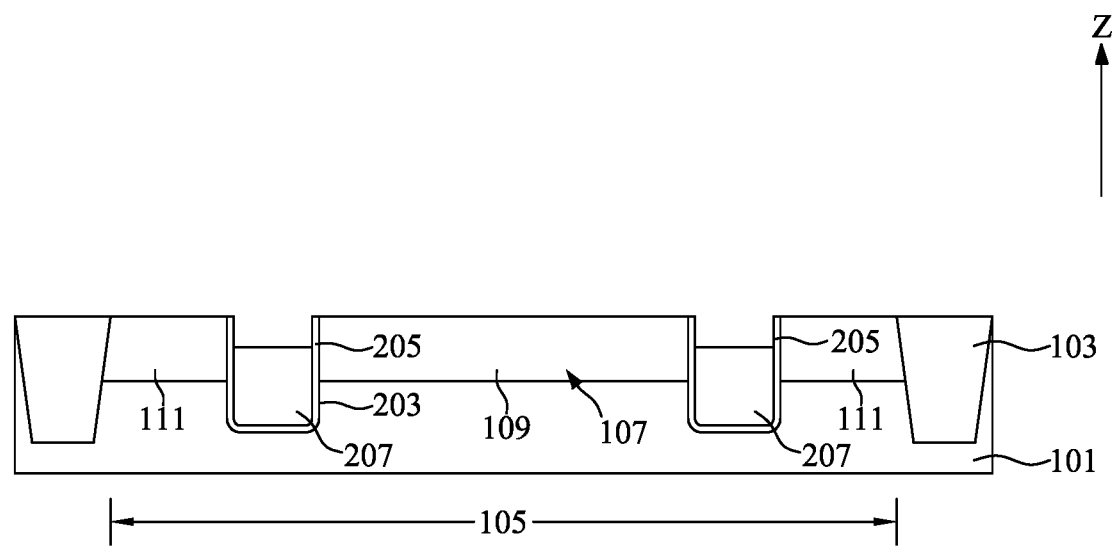

With reference to FIG. 11, in the embodiment depicted, a plurality of word line electrodes 207 may be respectively correspondingly formed on the plurality of word line insulating layers 205 in the plurality of word line recesses 203. A deposition process may be performed to deposit the plurality of word line electrodes 207. An etch-back process may be performed to make top surfaces of the plurality of word line electrodes 207 lower than a top surface of the substrate 101.

Figure 12:
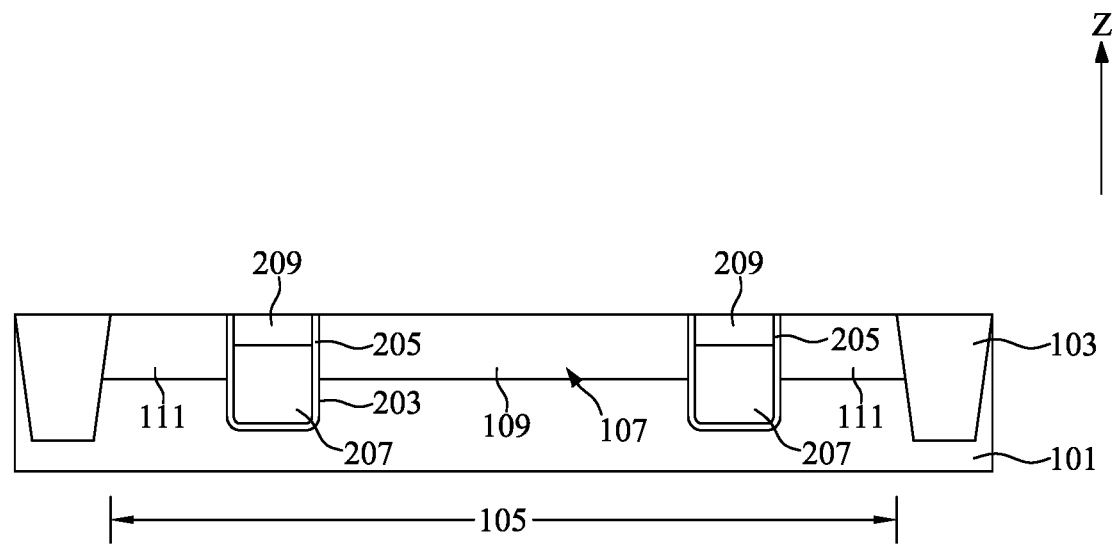
Figure 13:
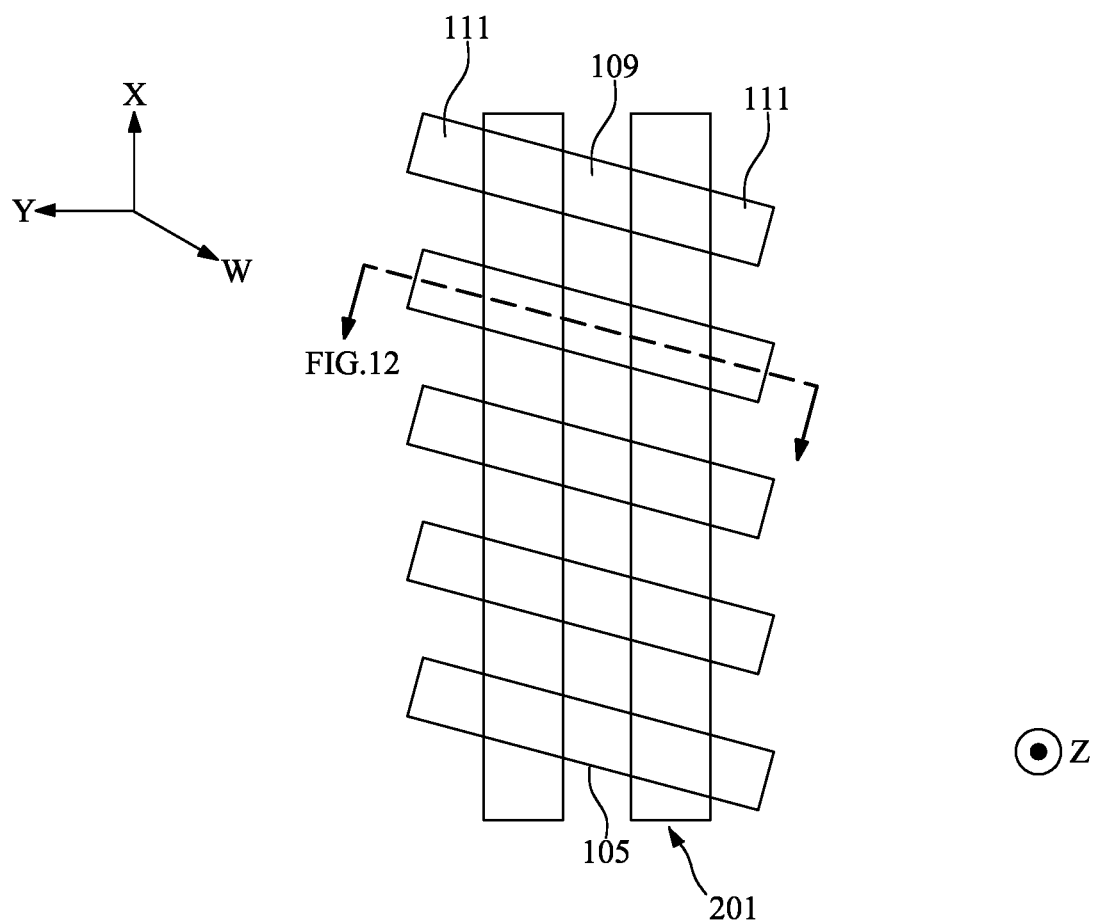
FIG. 13 illustrates, in a schematic top-view diagram, the semiconductor device in accordance with FIG. 12.

With reference to FIGS. 12 and 13, in the embodiment depicted, a plurality of word line capping layers 209 may be respectively correspondingly formed on the plurality of word line electrodes 207 in the plurality of word line recesses 203 by a deposition process. A planarization process, such as chemical mechanical polishing, may be performed to provide a substantially flat surface for subsequent processing steps. The plurality of word line insulating layers 205, the plurality of word line electrodes 207, and the plurality of word line capping layers 209 together form the plurality of word lines 201.

Figure 14:
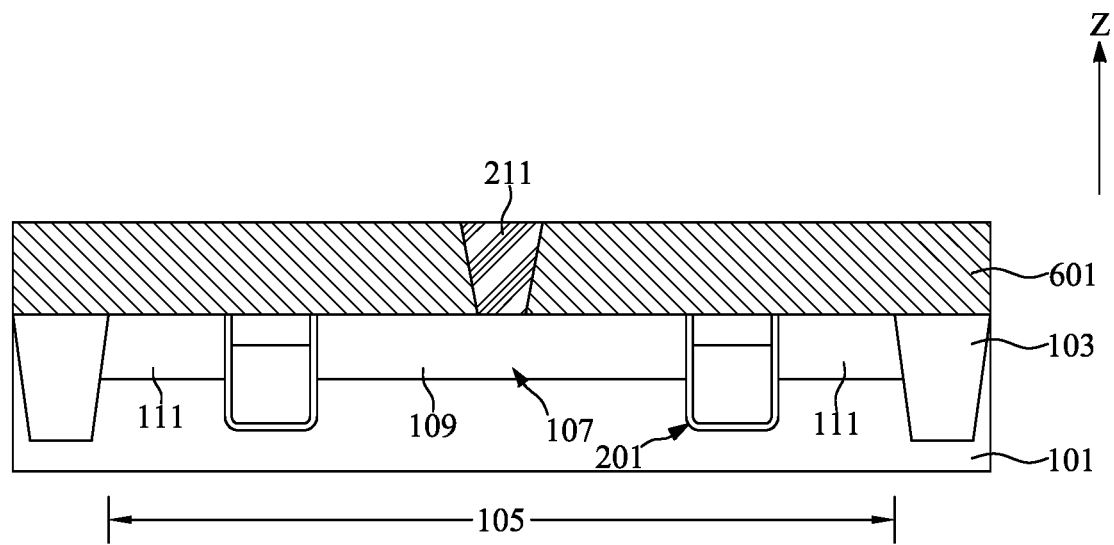
FIG. 14 illustrates, in a schematic cross-sectional diagram, part of the flow of fabricating a semiconductor device in accordance with one embodiment of the present disclosure.
Figure 15:
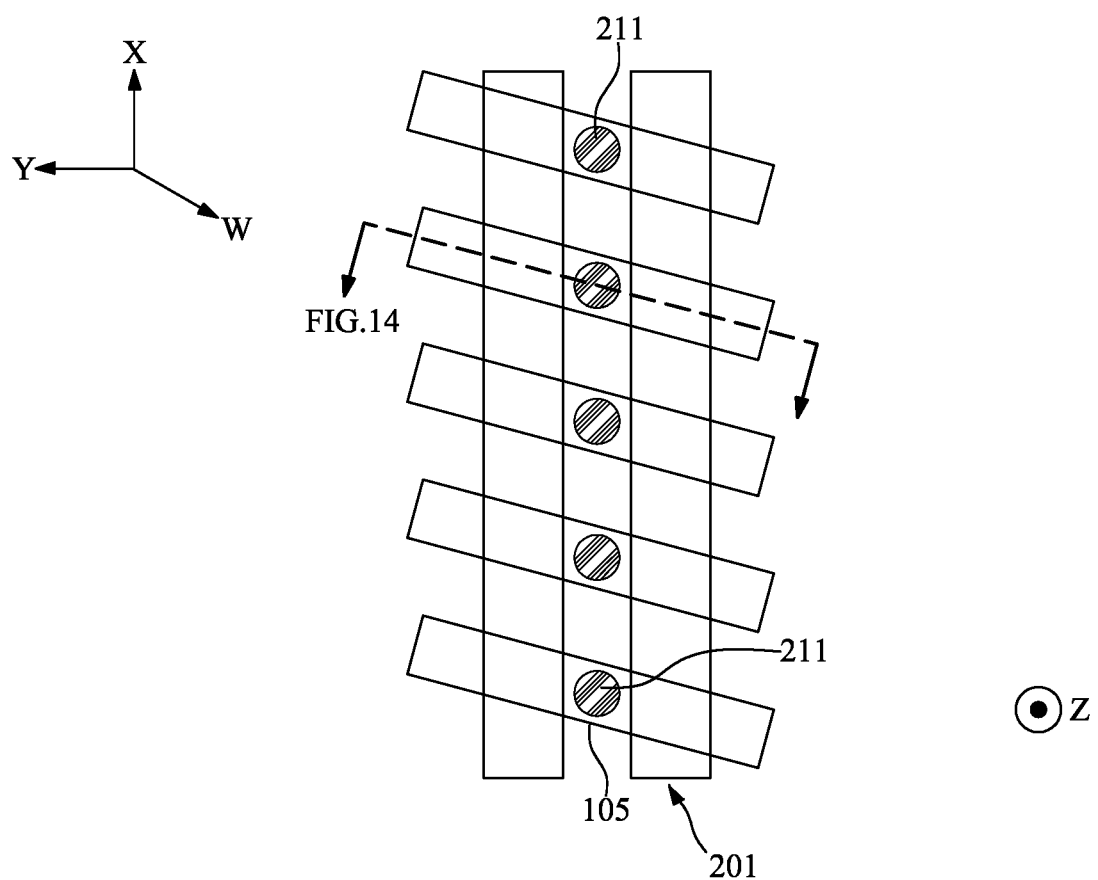
FIG. 15 illustrates, in a schematic top-view diagram, the semiconductor device in accordance with FIG. 14.
Figure 16:
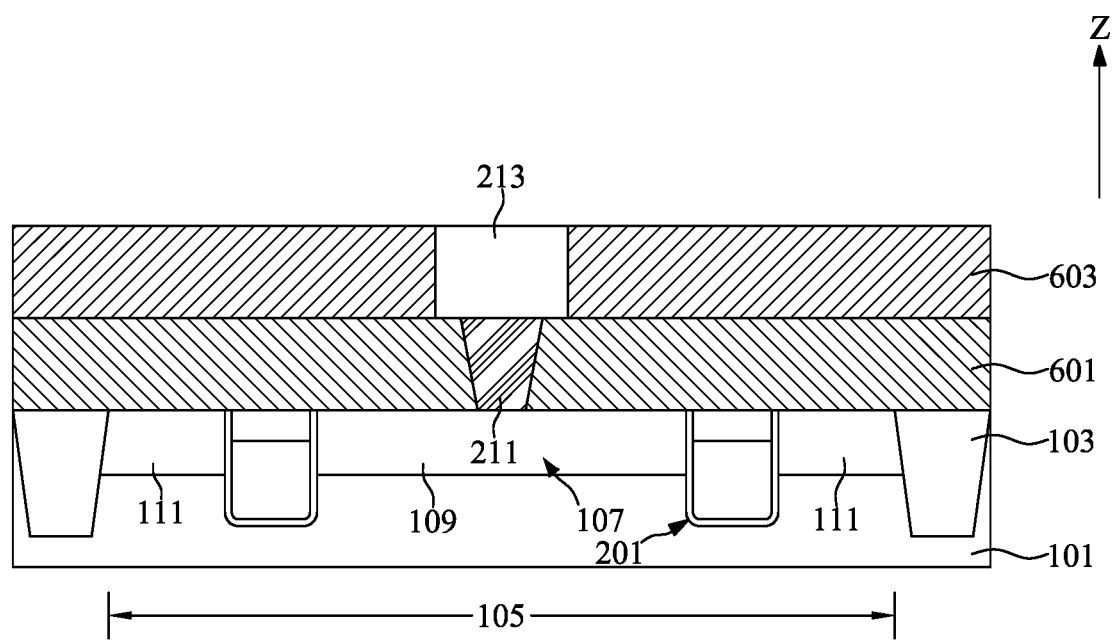
FIGS. 16 and 17 illustrate, in schematic cross-sectional diagrams, part of the flow of fabricating a semiconductor device in accordance with one embodiment of the present disclosure.
Figure 17:
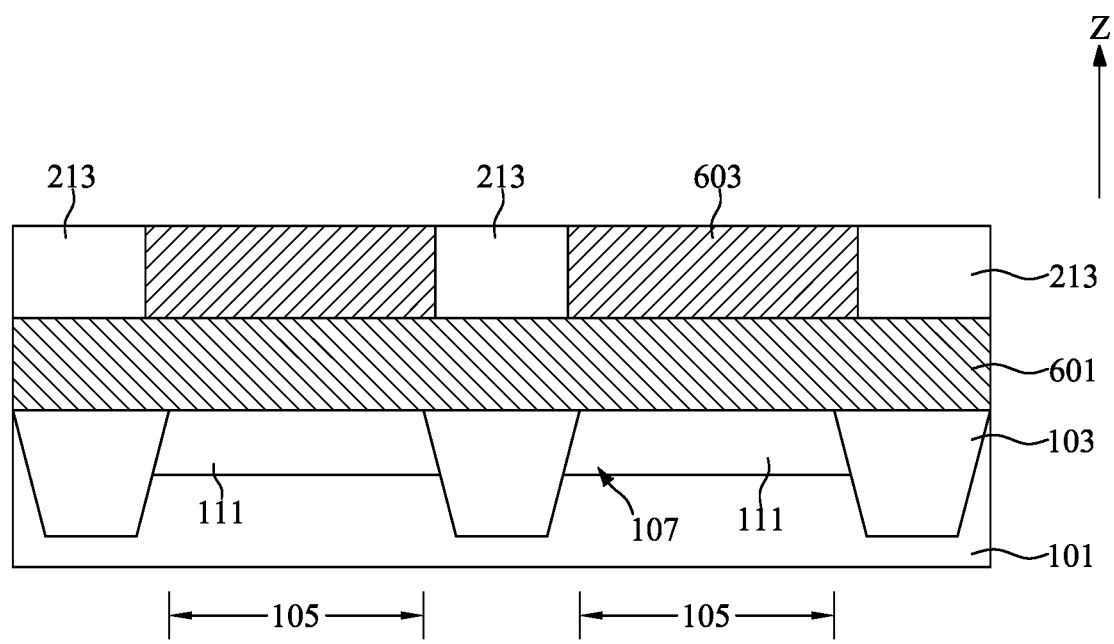
Figure 18:
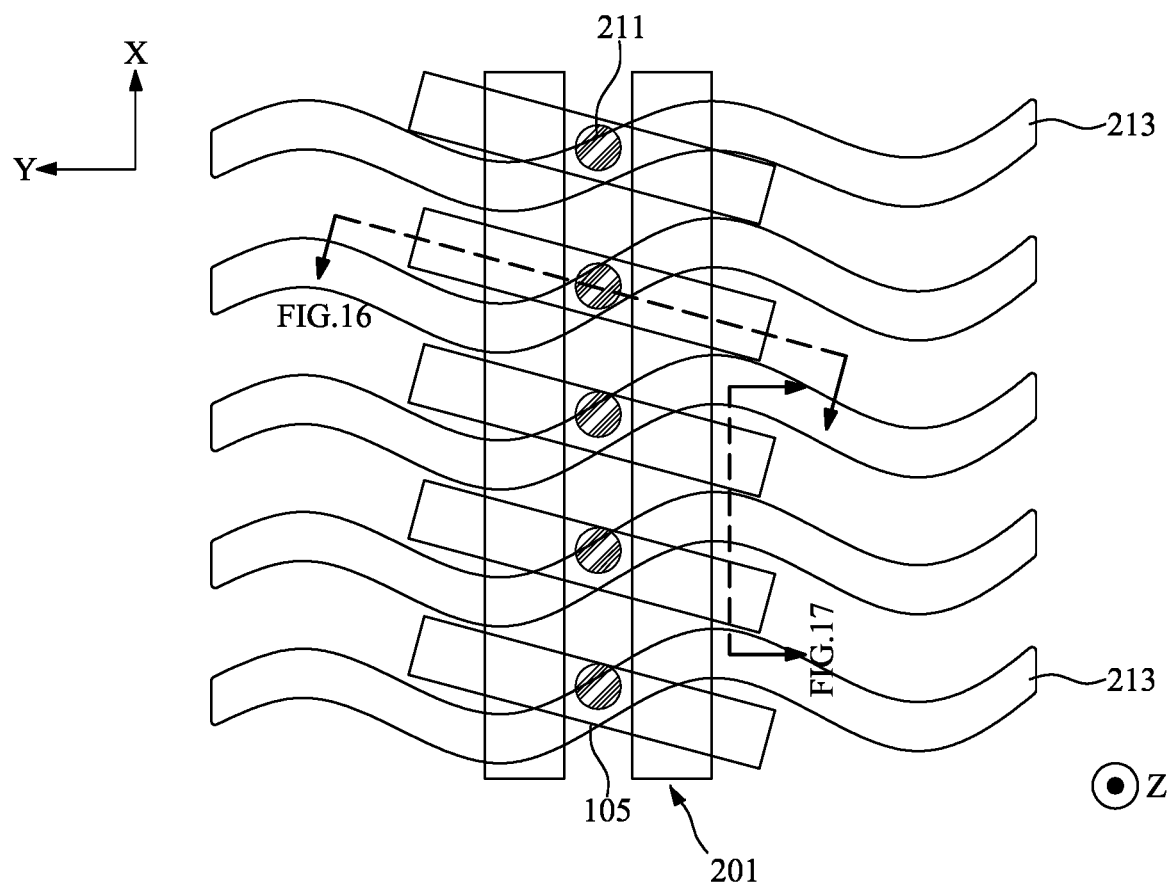
FIG. 18 illustrates, in a schematic top-view diagram, the semiconductor device in accordance with FIGS. 16 and 17.

FIG. 14 illustrates, in a schematic cross-sectional diagram, part of the flow of fabricating a semiconductor device in accordance with one embodiment of the present disclosure. FIG. 15 illustrates, in a schematic top-view diagram, the semiconductor device in accordance with FIG. 14. FIGS. 16 and 17 illustrate, in schematic cross-sectional diagrams, part of the flow of fabricating a semiconductor device in accordance with one embodiment of the present disclosure. FIG. 18 illustrates, in a schematic top-view diagram, the semiconductor device in accordance with FIGS. 16 and 17. Some elements of the semiconductor device of the present disclosure are not shown in FIGS. 15 and 18 for clarity.

With reference to FIG. 4 and FIGS. 14 to 18, at step S19, in the embodiment depicted, a plurality of bit lines 213 may be formed above the substrate 101. With reference to FIGS. 14 and 15, in the embodiment depicted, a first insulating film 601 may be formed on the substrate 101. A photolithography process may be performed to define positions of a plurality of bit line contacts 211 in the first insulating film 601. After the photolithography process, an etch process, such as an anisotropic dry etch process, may be performed to form a plurality of openings penetrating through the first insulating film 601 and exposing the plurality of first doped regions 109. A conductive material such as doped polysilicon, metal, metal nitride, or metal silicide may be deposited into the plurality of openings by a deposition process. After the deposition process, a planarization process, such as chemical mechanical polishing, may be performed to remove excess filling material, provide a substantially flat surface for subsequent processing steps, and conformally form the plurality of bit line contacts 211.

With reference to FIGS. 16 to 18, in the embodiment depicted, a second insulating film 603 may be formed on the first insulating film 601. A photolithography process may be performed to define positions of the plurality of bit lines 213 in the second insulating film 603. After the photolithography process, an etch process, such as an anisotropic dry etch process, may be performed to form a plurality of openings penetrating through the second insulating film 603 and exposing the plurality of bit line contacts 211. A conductive material such as tungsten, aluminum, copper, nickel, or cobalt may be deposited into the plurality of openings by a deposition process. After the deposition process, a planarization process, such as chemical mechanical polishing, may be performed to remove excess filling material, provide a substantially flat surface for subsequent processing steps, and conformally form the plurality of bit lines 213. The plurality of bit lines 213 may extend along a direction Y and implemented as undulating strips as viewed from above. The direction Y may be perpendicular to the direction X.

Figure 19:
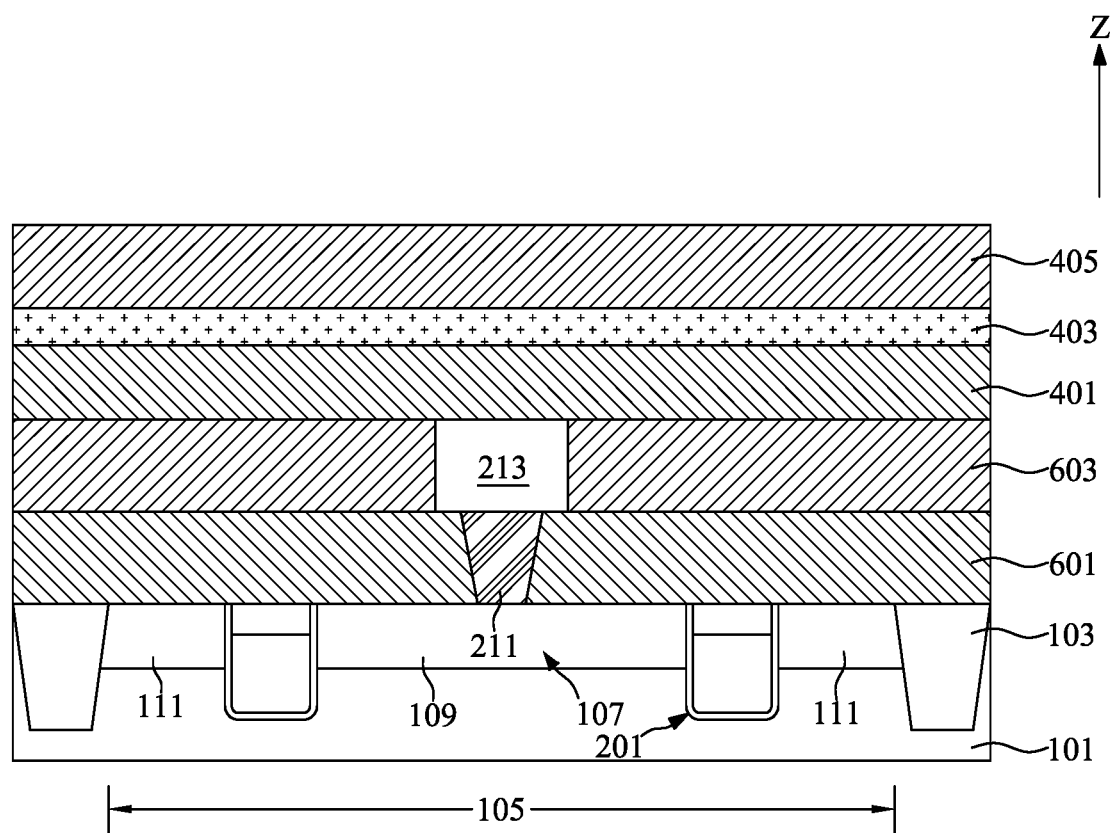
FIGS. 19 and 20 illustrate, in schematic cross-sectional diagrams, part of the flow of fabricating a semiconductor device in accordance with one embodiment of the present disclosure.
Figure 20:
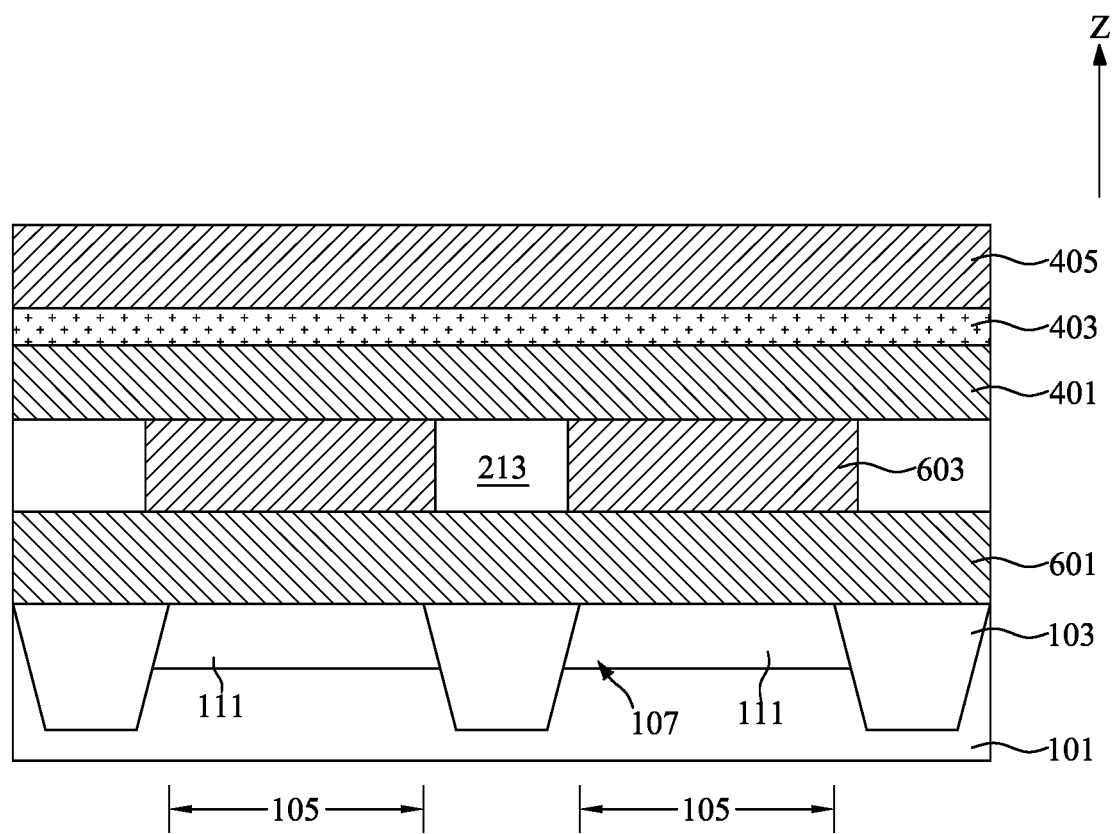
Figure 21:
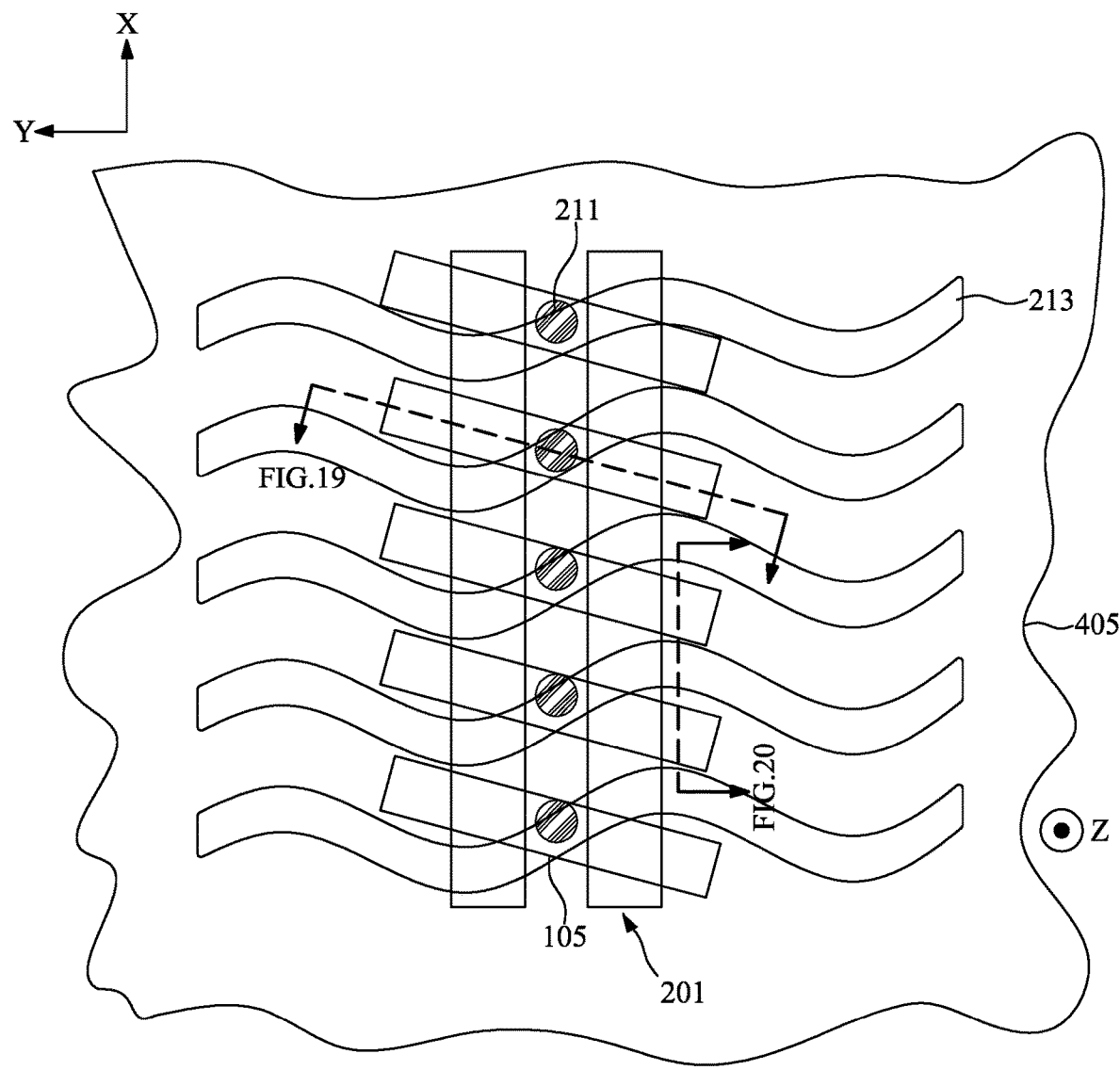
FIG. 21 illustrates, in a schematic top-view diagram, the semiconductor device in accordance with FIGS. 19 and 20.
Figure 22:
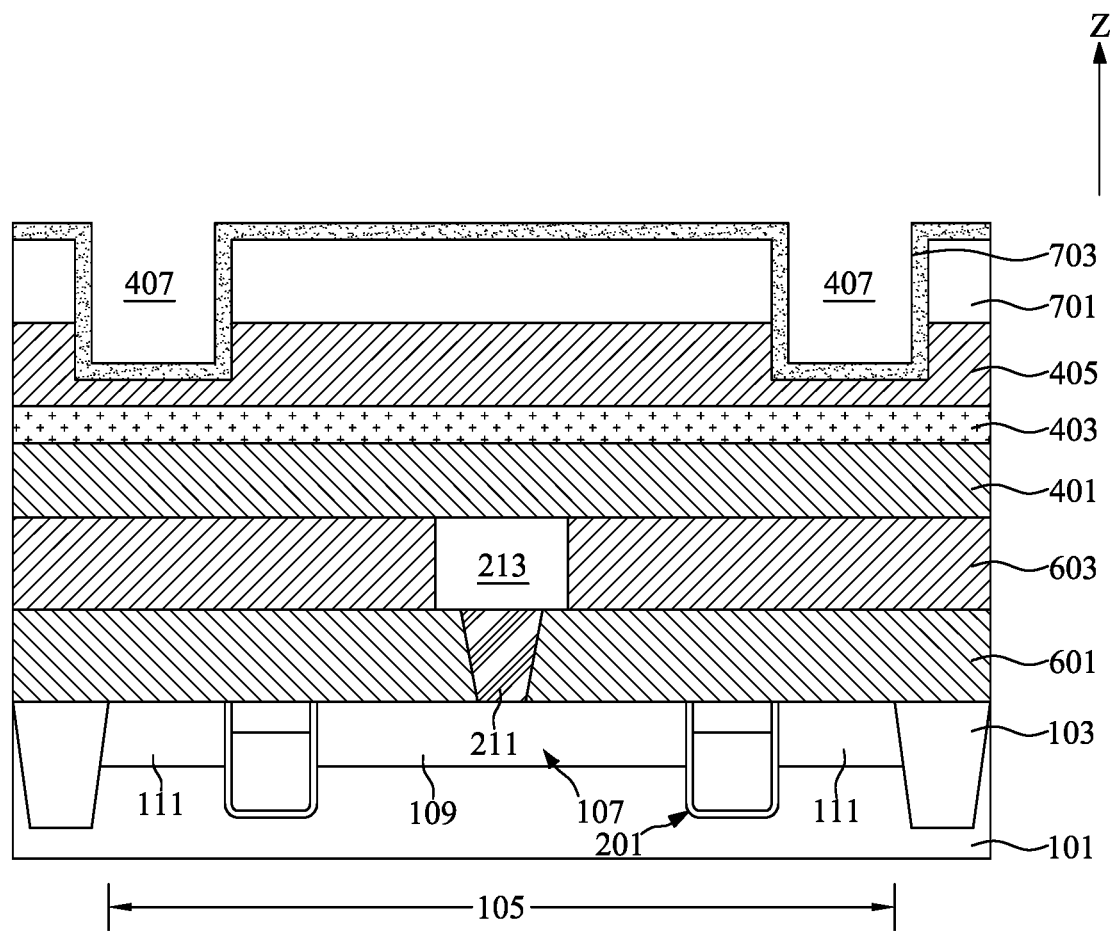
FIGS. 22 and 23 illustrate, in schematic cross-sectional diagrams, part of the flow of fabricating a semiconductor device in accordance with one embodiment of the present disclosure.
Figure 23:
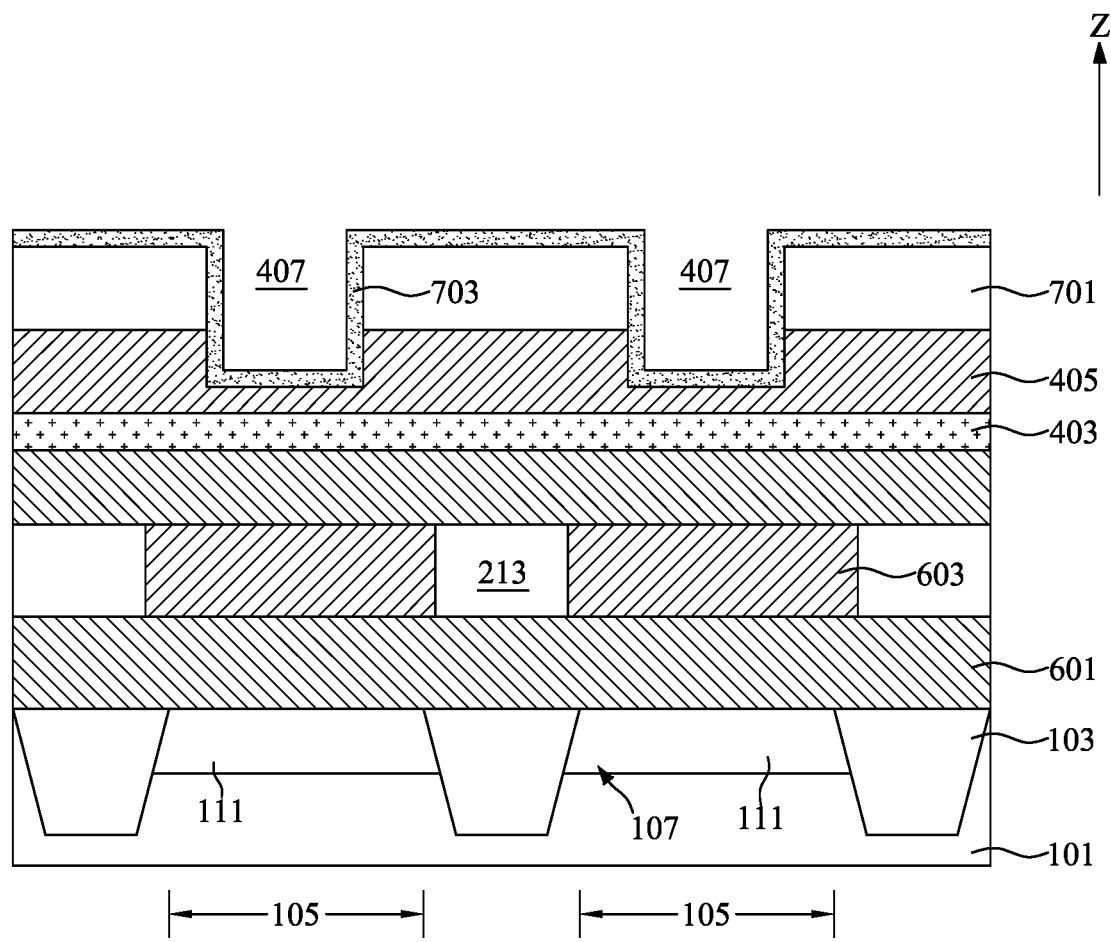
Figure 24:
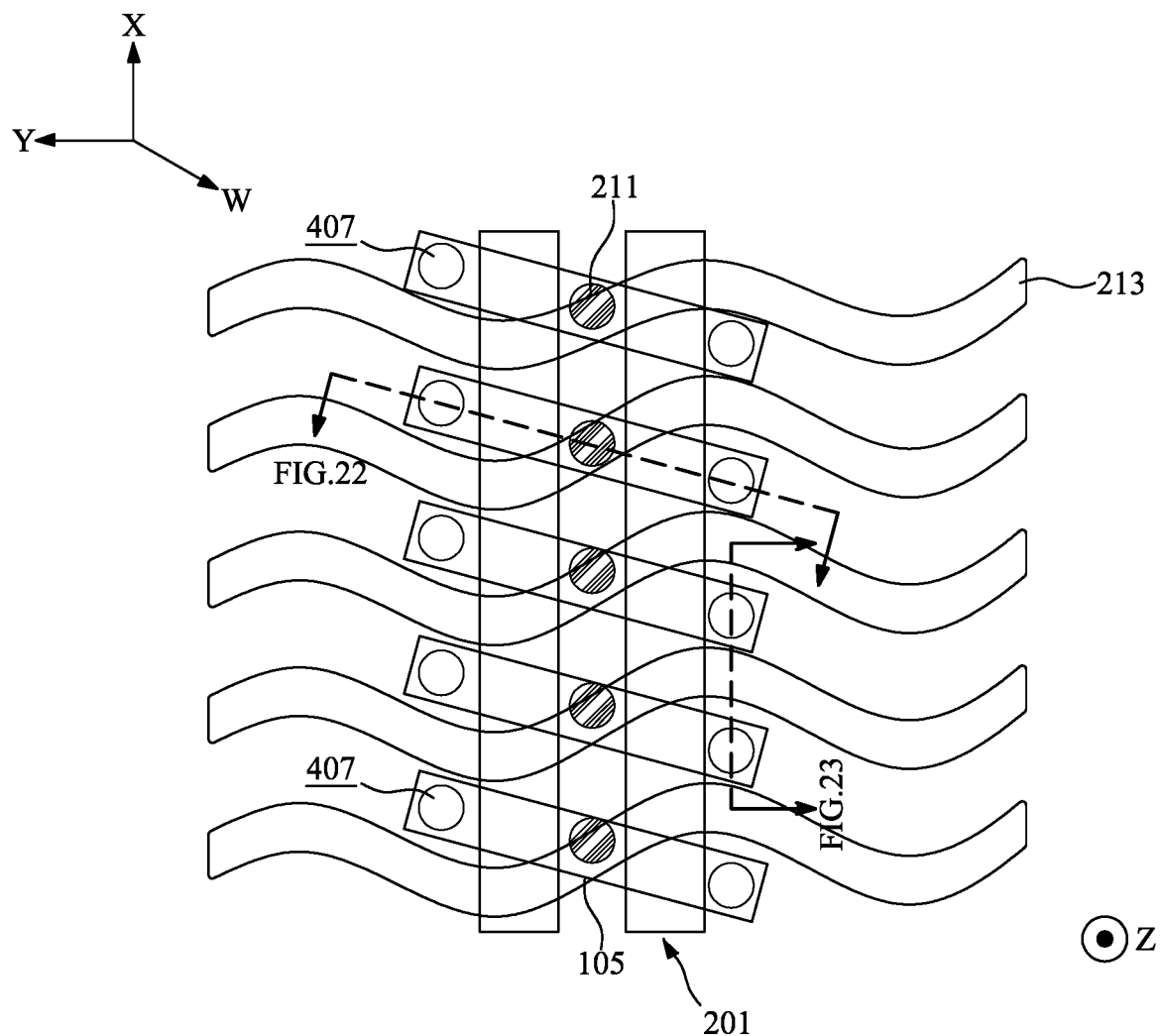
FIG. 24 illustrates, in a schematic top-view diagram, the semiconductor device in accordance with FIGS. 22 and 23.
Figure 25:
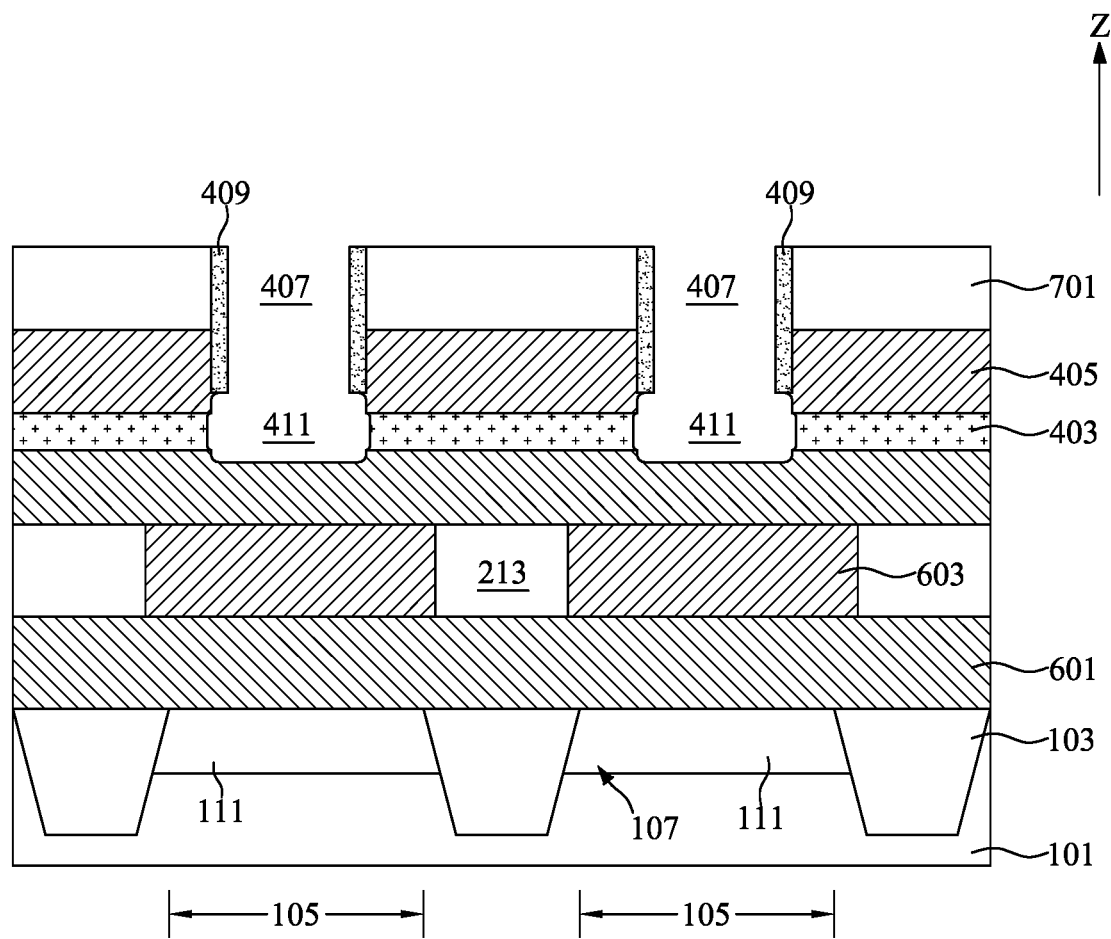
FIGS. 25 to 27 illustrate, in schematic cross-sectional diagrams, part of the flow of fabricating a semiconductor device in accordance with one embodiment of the present disclosure.
Figure 26:
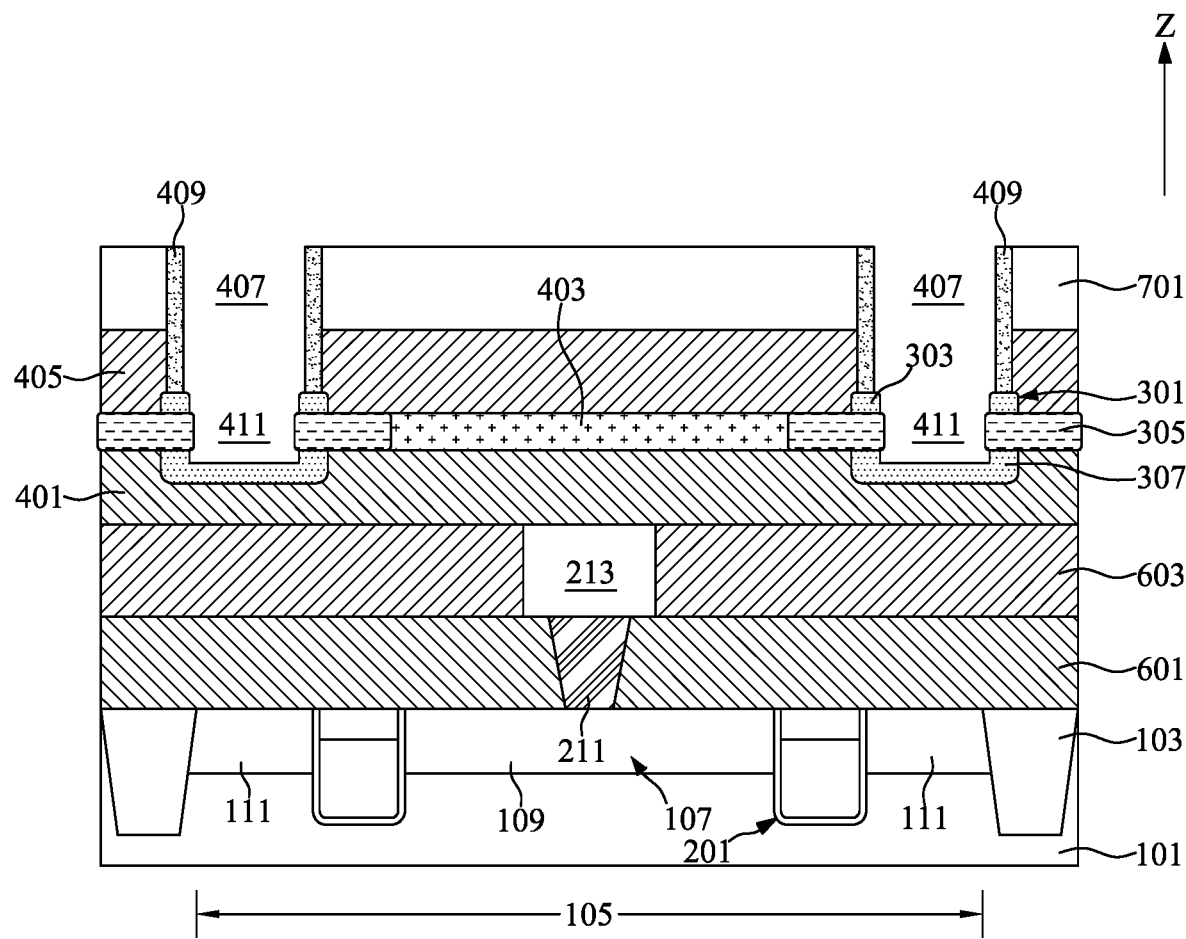
Figure 27:
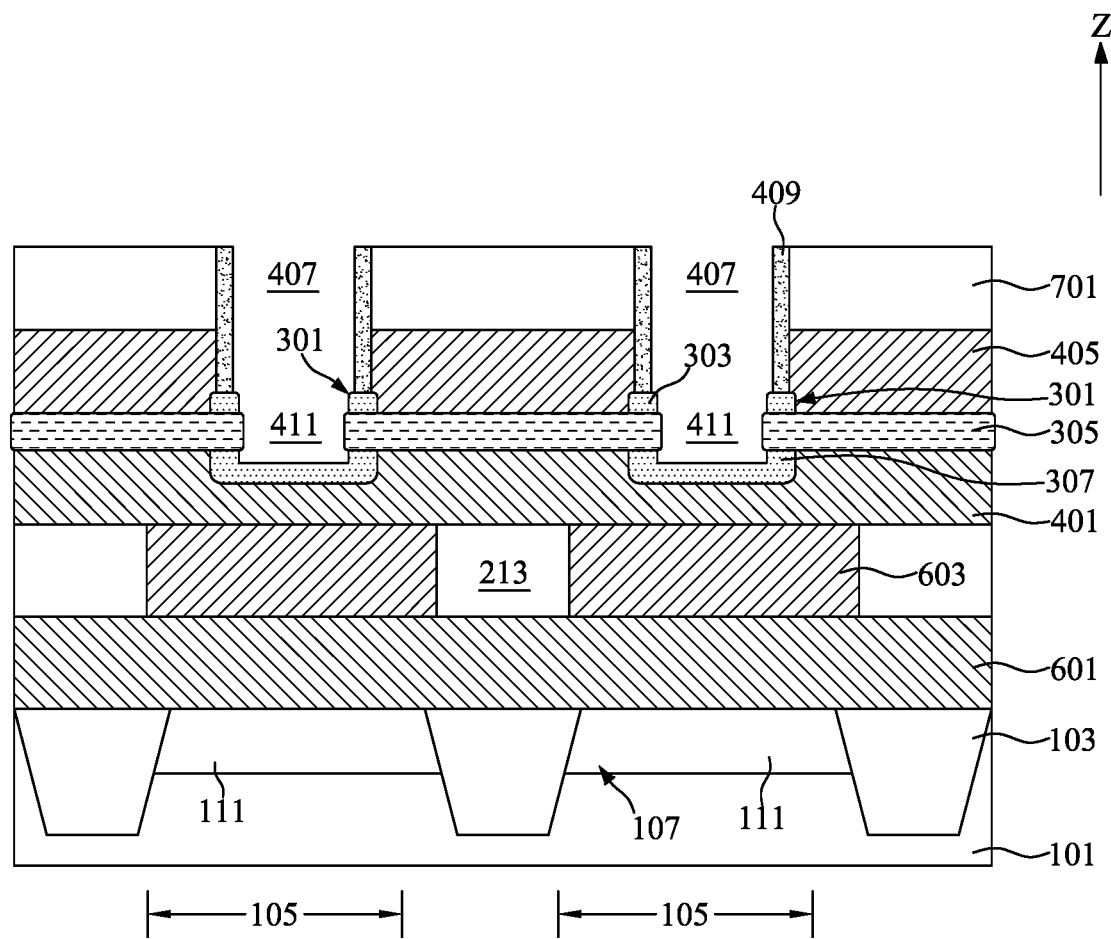
Figure 28:
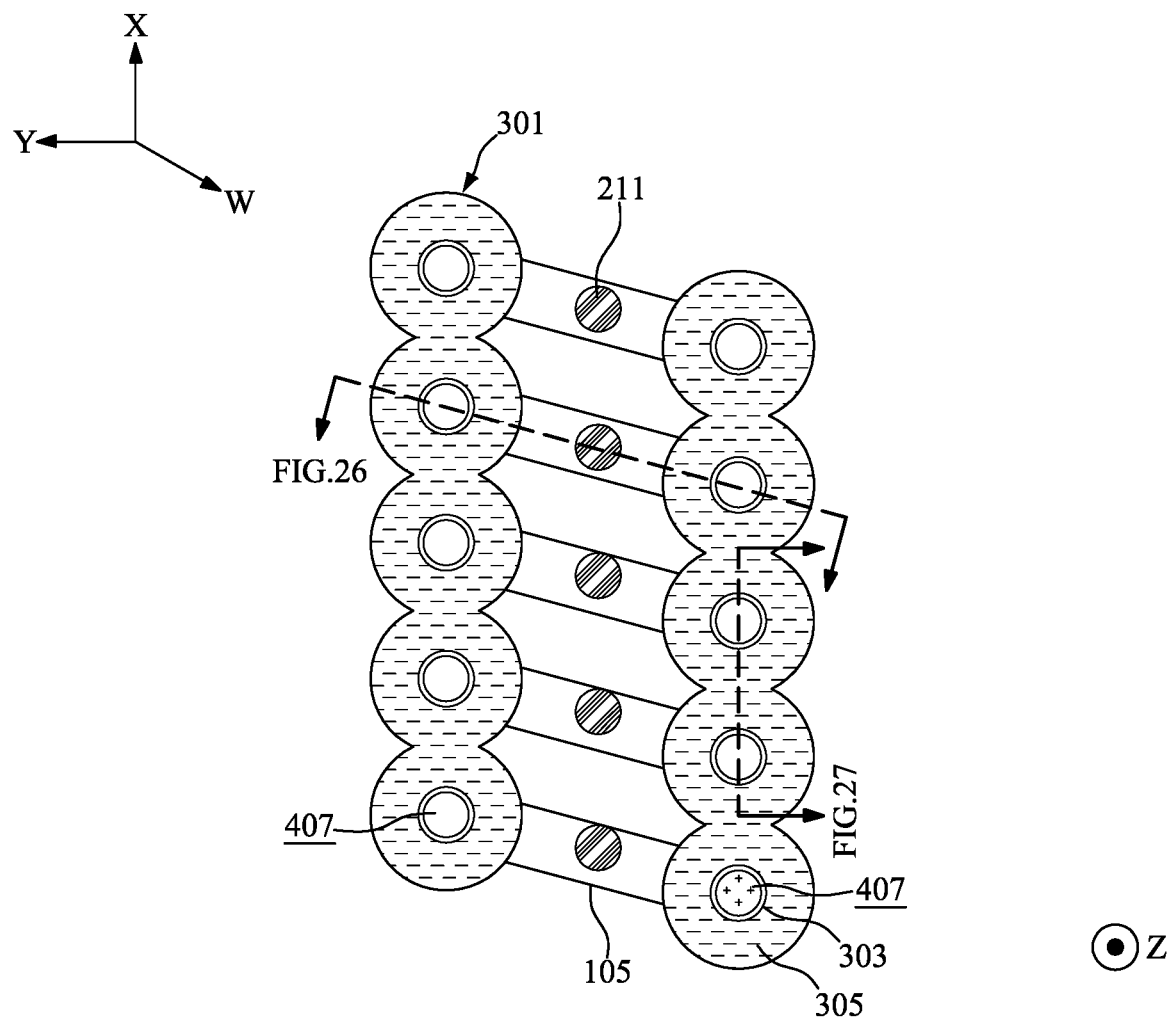
FIG. 28 illustrates, in a schematic top-view diagram, the semiconductor device in accordance with FIGS. 26 and 27.

FIGS. 19 and 20 illustrate, in schematic cross-sectional diagrams, part of the flow of fabricating a semiconductor device in accordance with one embodiment of the present disclosure. FIG. 21 illustrates, in a schematic top-view diagram, the semiconductor device in accordance with FIGS. 19 and 20. FIGS. 22 and 23 illustrate, in schematic cross-sectional diagrams, part of the flow of fabricating a semiconductor device in accordance with one embodiment of the present disclosure. FIG. 24 illustrates, in a schematic top-view diagram, the semiconductor device in accordance with FIGS. 22 and 23. FIGS. 25 to 27 illustrate, in schematic cross-sectional diagrams, part of the flow of fabricating a semiconductor device in accordance with one embodiment of the present disclosure. FIG. 28 illustrates, in a schematic top-view diagram, the semiconductor device in accordance with FIGS. 26 and 27. Some elements of the semiconductor device of the present disclosure are not shown in FIGS. 21, 24, and 28 for clarity.

With reference to FIG. 4 and FIGS. 19 to 28, at step S21, in the embodiment depicted, a plurality of holding structures 301 may be formed above the substrate 101. With reference to FIGS. 19 to 21, in the embodiment depicted, a series of deposition processes may be performed to deposit a bottom insulating film 401, a middle insulating film 403, and a top insulating film 405. The bottom insulating film 401 may be formed on the second insulating film 603. The middle insulating film 403 may be formed on the bottom insulating film 401, and the top insulating film 405 may be formed on the middle insulating film 403. The bottom insulating film 401 and the top insulating film 405 may be formed of a first material. The middle insulating film 403 may be formed of a second material. A density of the first material may be greater than that of the second material. Specifically, the first material may include polysilicon and the second material may include doped polysilicon. Alternatively, in another embodiment, the first material and the second material may include oxidizable material. Alternatively, in another embodiment, the first material may include undoped oxidizable material or doped oxidizable material. The second material may include doped material or doped oxidizable material. Alternatively, in another embodiment, the first material may be undoped oxide. A ratio of a thickness of the top insulating film 405 to a thickness of the middle insulating film 403 may be between 5:1 and 1:1.

With reference to FIGS. 22 to 24, in the embodiment depicted, a mask layer 701 may be formed on the top insulating film 405. A photolithography process may be performed to define positions of a plurality of in-process recesses 407. After the photolithography process, an etch process, such as an anisotropic dry etch process, may be performed to form the plurality of in-process recesses 407 in the mask layer 701 and the top insulating film 405. A sacrificial layer 703 may be deposited from above to cover top surfaces of the mask layer 701, sidewalls of the plurality of in-process recesses 407, and bottoms of the plurality of in-process recesses 407. The sacrificial layer 703 may be formed of a material having an etching selectivity with respect to the top insulating film 405. Specifically, the sacrificial layer 703 is formed of doped oxide such as borosilica glass, phosphosilica glass, borophosphosilica glass, fluoride silicate glass, carbon doped silicon oxide, or the like. The top insulating film 405 may be formed of undoped oxide. Alternatively, in another embodiment, the sacrificial layer 703 may be formed of a thermal decomposable polymer or a thermal degradable polymer. The thermal decomposable polymer or the thermal degradable polymer decomposes or degrades into a gaseous state when exposed to a temperature exceeding the decomposition temperature of the thermal decomposable polymer or the degradation temperature of the thermal degradable polymer.

With reference to FIG. 25, in the embodiment depicted, an anisotropic dry etch process may be performed to remove a portion of the sacrificial layer 703 covering the top surfaces of the mask layer 701 and the bottom of the plurality of in-process recesses 407. After the anisotropic dry etch process, the sacrificial layer 703 may be turned into a plurality of sacrificial liners 409. A wet etch process may be sequentially performed to etch a plurality of etched spaces 411 respectively correspondingly below the plurality of in-process recesses 407. The plurality of etched spaces 411 may respectively correspondingly penetrate through lower portions of the top insulating film 405, portions of the middle insulating film 403, and upper portions of the bottom insulating film 401. The wet etch process may have a higher etching rate for the middle insulating film 403 formed of the second material than for the bottom insulating film 401 or the top insulating film 405 formed of the first material. Therefore, the middle insulating film 403 may be removed faster, with more material removed, than the bottom insulating film 401 or the top insulating film 405. In other words, volumes of the plurality of etched spaces 411 located in the middle insulating film 403 may be greater than volumes of the plurality of etched spaces 411 located in the bottom insulating film 401 and in the top insulating film 405.

With reference to FIGS. 26 to 28, an oxidation process may be performed to oxidize the plurality of etched spaces 411. Regions of the bottom insulating film 401, the middle insulating film 403, and the top insulating film 405 exposed through the plurality of etched spaces 411 may be oxidized and turned into a plurality of bottom holding structures 307, a plurality of middle holding structures 305, and a plurality of top holding structures 303, respectively. The plurality of bottom holding structures 307 may be disposed in the bottom insulating film 401 and respectively correspondingly above the plurality of second doped regions 111. The plurality of middle holding structures 305 may be disposed in the middle insulating film 403 and above the plurality of bottom holding structures 307. The plurality of top holding structures 303 may be disposed in the top insulating film 405 and above the plurality of middle holding structures 305.

With reference to FIGS. 26 to 28, the oxidation process may have a higher oxidizing rate for the middle insulating film 403 formed of the second material than for the bottom insulating film 401 or top insulating film 405 formed of the first material; therefore, a greater portion of the middle insulating film 403 may be oxidized. Specifically, the regions of the middle insulating film 403 adjacent to the plurality of etched spaces 411 and along the direction X are oxidized into the plurality of middle holding structures 305 connected to each other along the direction X. In contrast, after the oxidation process, the plurality of middle holding structures 305 along the direction W or the direction X are still separated from each other. The plurality of top holding structures 303, the plurality of middle holding structures 305, and the plurality of bottom holding structures 307 together form the plurality of holding structures 301.

Figure 29:
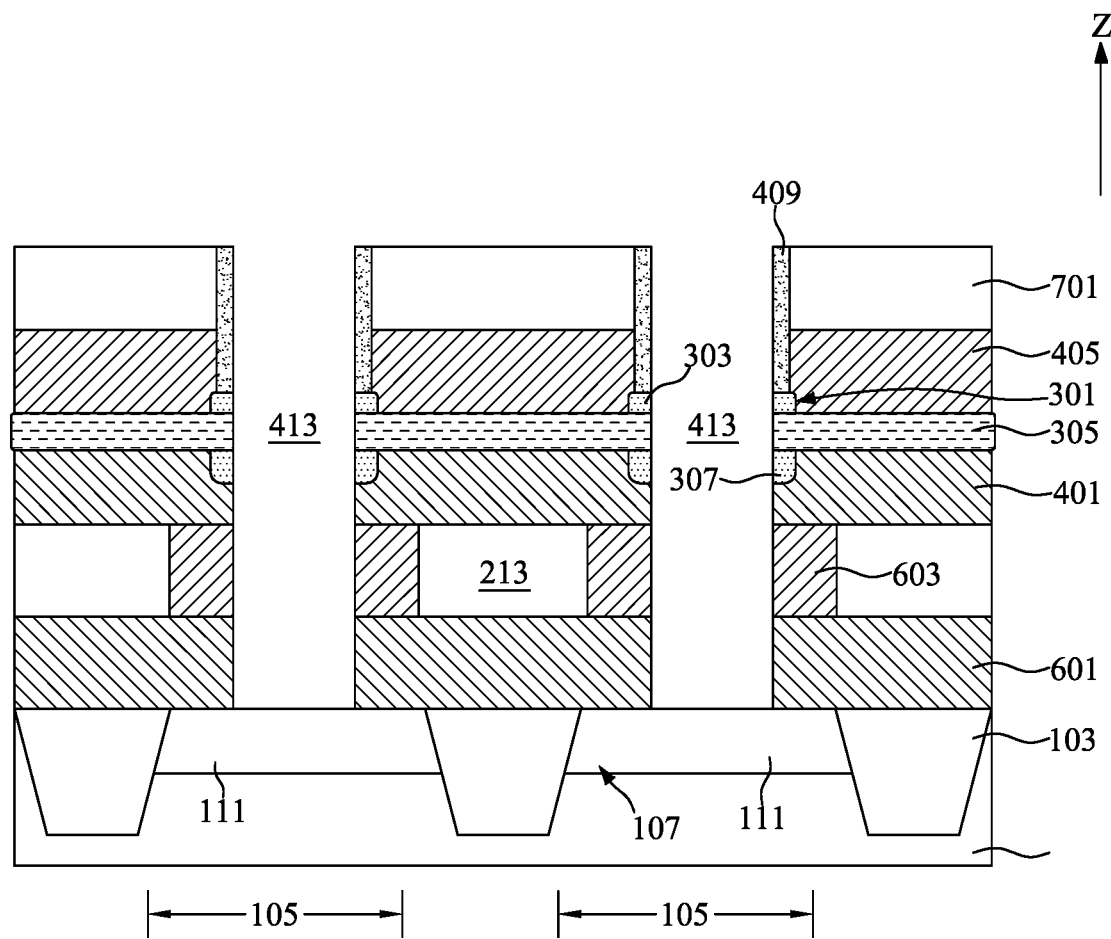
FIG. 29 illustrates, in a schematic cross-sectional diagram, part of the flow of fabricating a semiconductor device in accordance with one embodiment of the present disclosure.
Figure 30:
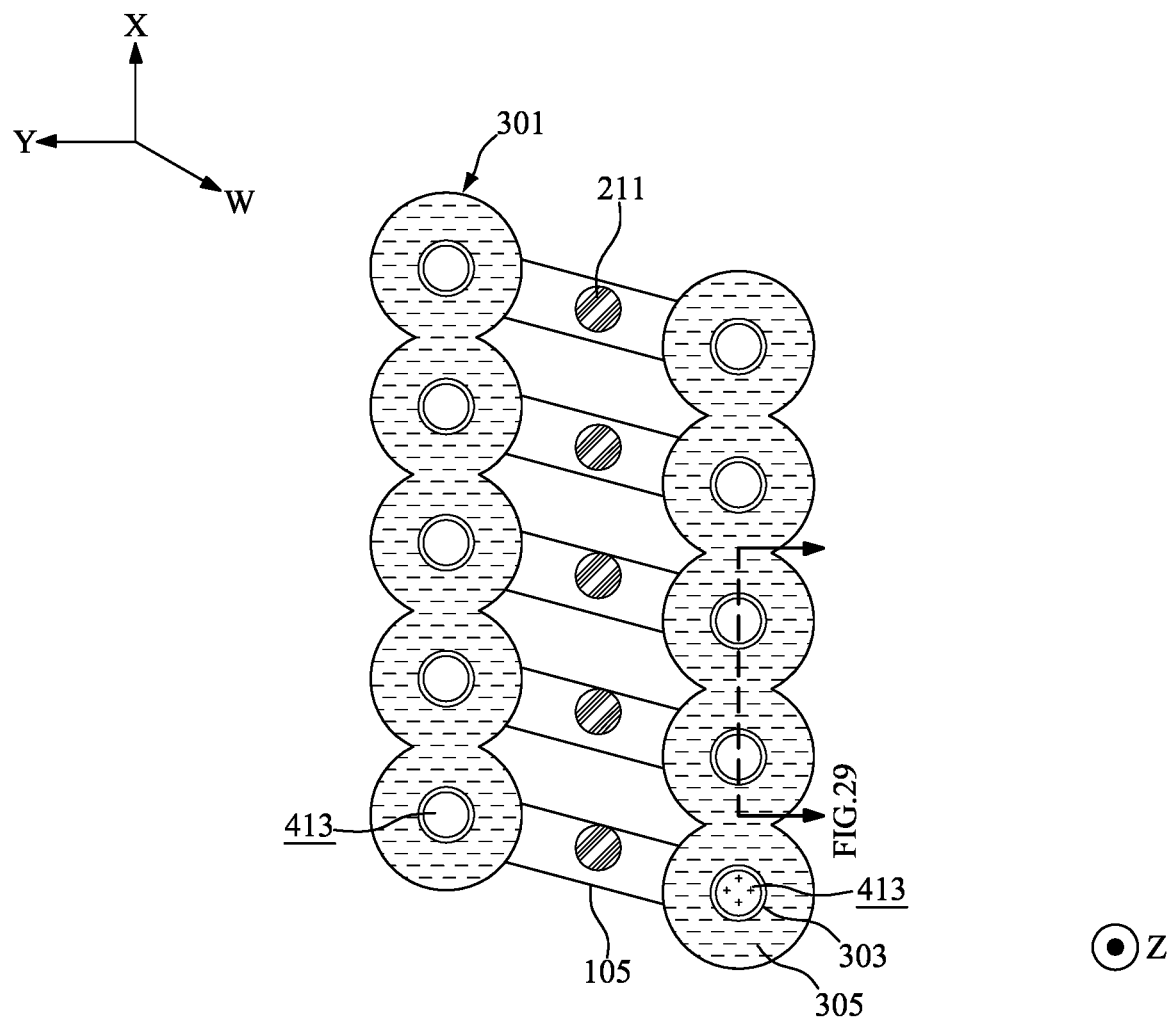
FIG. 30 illustrates, in a schematic top-view diagram, the semiconductor device in accordance with FIG. 29.

FIG. 29 illustrates, in a schematic cross-sectional diagram, part of the flow of fabricating a semiconductor device in accordance with one embodiment of the present disclosure. FIG. 30 illustrates, in a schematic top-view diagram, the semiconductor device in accordance with FIG. 29. FIGS. 31 to 35 illustrate, in schematic cross-sectional diagrams, part of the flow of fabricating a semiconductor device in accordance with one embodiment of the present disclosure.

Some elements of the semiconductor device of the present disclosure are not shown in FIG. 29 for clarity.

With reference to FIG. 4 and FIGS. 29 to 35, at step S23, in the embodiment depicted, a plurality of plugs 415 and a plurality of air gaps 421 may be formed above the substrate 101. With reference to FIGS. 29 and 30, the plurality of in-process recesses 407 and the plurality of etched spaces 411 may be further deepened to form a plurality of plug recesses 413 penetrating through the mask layer 701, the top insulating film 405, the plurality of middle holding structures 305, the bottom insulating film 401, the second insulating film 603, and the first insulating film 601. The plurality of second doped regions 111 may be respectively correspondingly exposed through the plurality of plug recesses 413.

Figure 31:
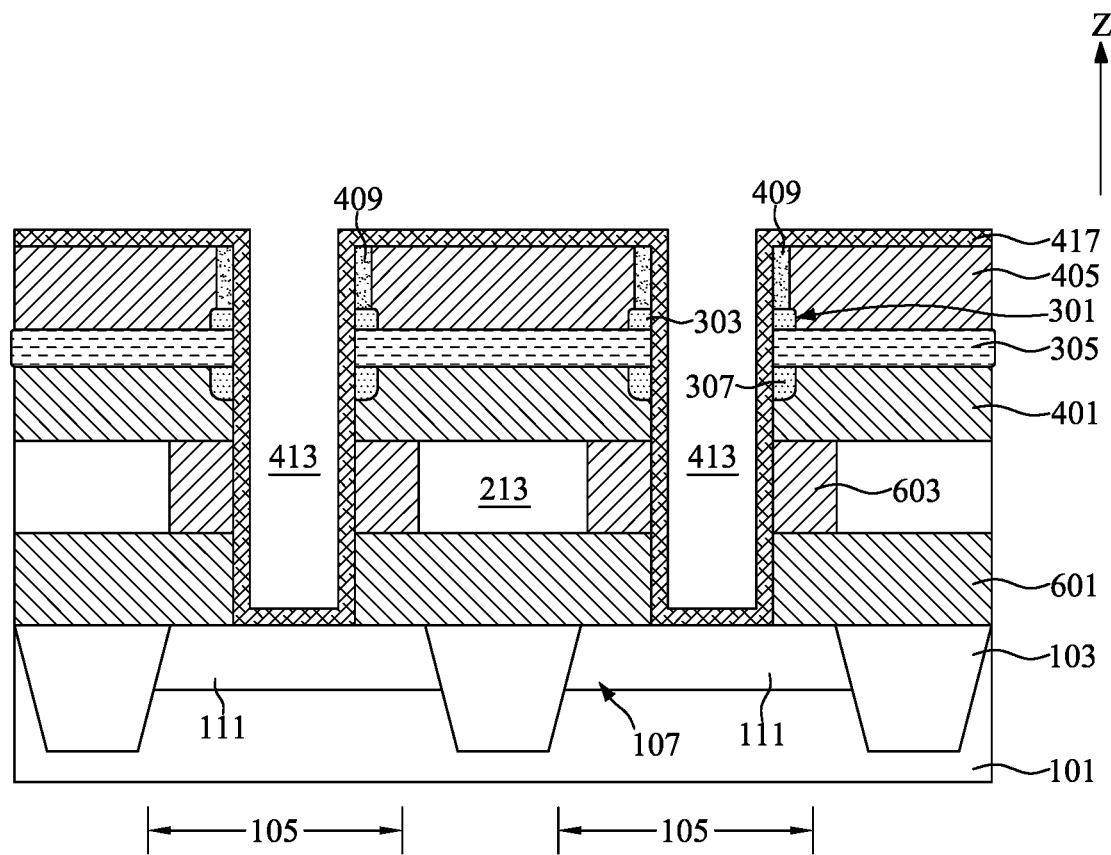
FIGS. 31 to 38 illustrate, in schematic cross-sectional diagrams, part of the flow of fabricating a semiconductor device in accordance with one embodiment of the present disclosure.
Figure 32:
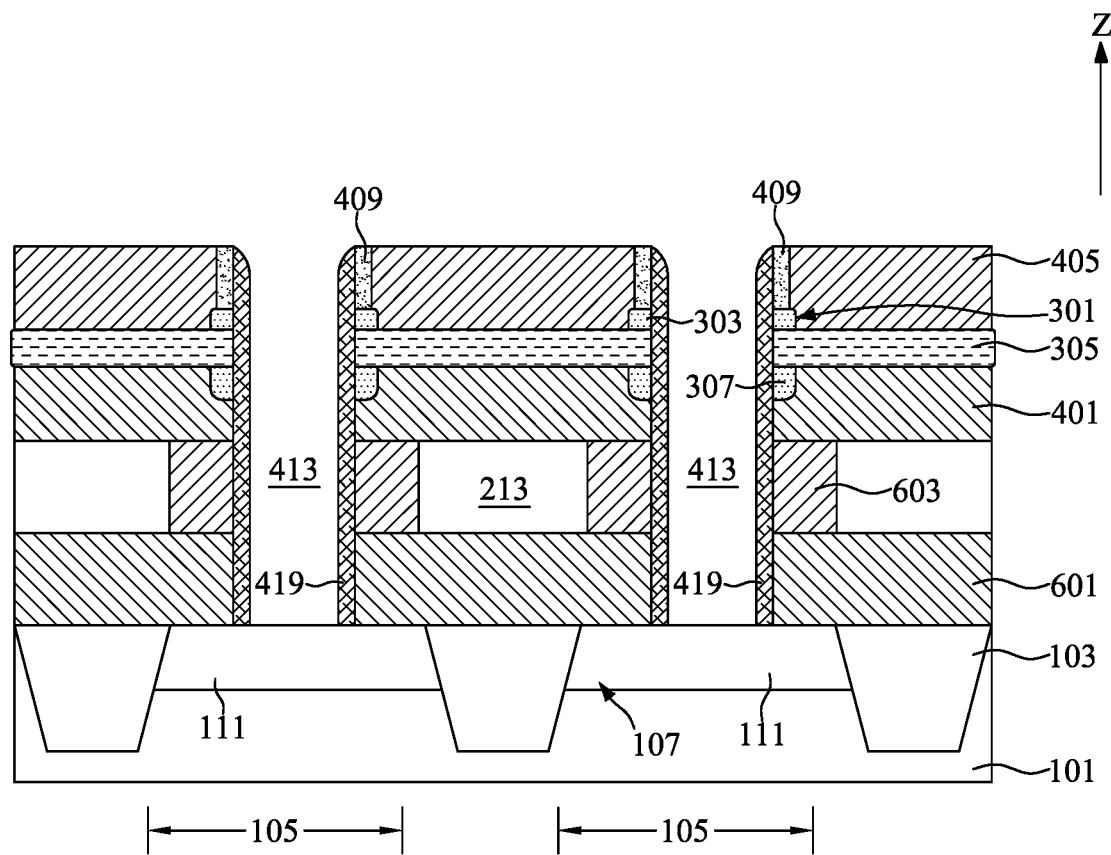

With reference to FIG. 31, in the embodiment depicted, the mask layer 701 may be removed. Next, a spacer layer 417 may be deposited to cover top surfaces of the top insulating film 405, sidewalls of the plurality of plug recesses 413, and bottoms of the plurality of plug recesses 413. The spacer layer 417 may be formed of undoped oxide such as silicon oxide, silicon nitride, silicon oxynitride, or silicon nitride oxide. Specifically, the spacer layer 417 is formed of silicon oxide. With reference to FIG. 32, in the embodiment depicted, an etch process, such as an anisotropic dry etch process, may be performed to remove the spacer layer 417 covering the top surfaces of the top insulating film 405 and the bottoms of the plurality of plug recesses 413 and conformally form a plurality of spacers 419 respectively correspondingly attached to the sidewalls of the plurality of plug recesses 413. The plurality of sacrificial liners 409 may be exposed after the etch process.

Figure 33:
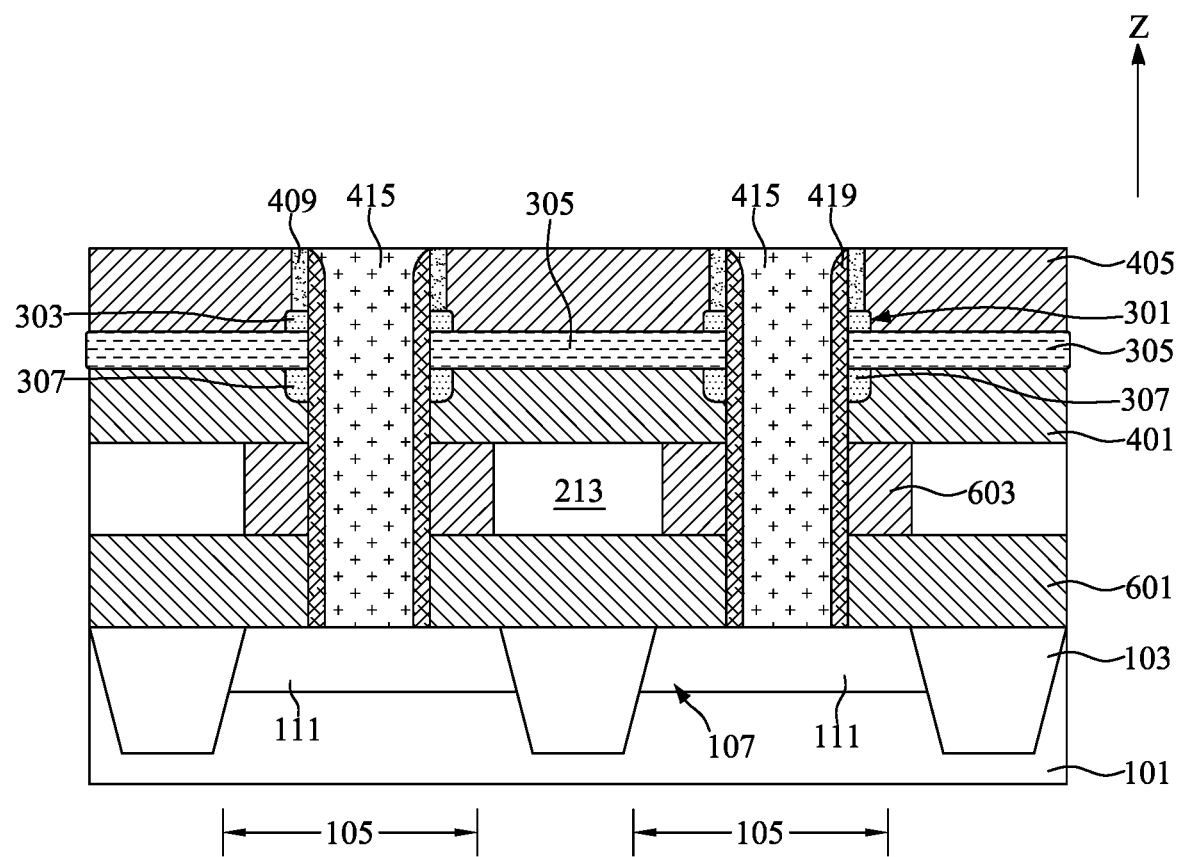

With reference to FIG. 33, in the embodiment depicted, a conductive material such as doped polysilicon, titanium, titanium nitride, tantalum, tantalum nitride, tungsten, copper, aluminum or aluminum alloy may be deposited into the plurality of plug recesses 413 by a deposition process. After the deposition process, a planarization process, such as chemical mechanical polishing, may be performed to remove excess filling material, provide a substantially flat surface for subsequent processing steps, and conformally form the plurality of plugs 415.

Figure 34:
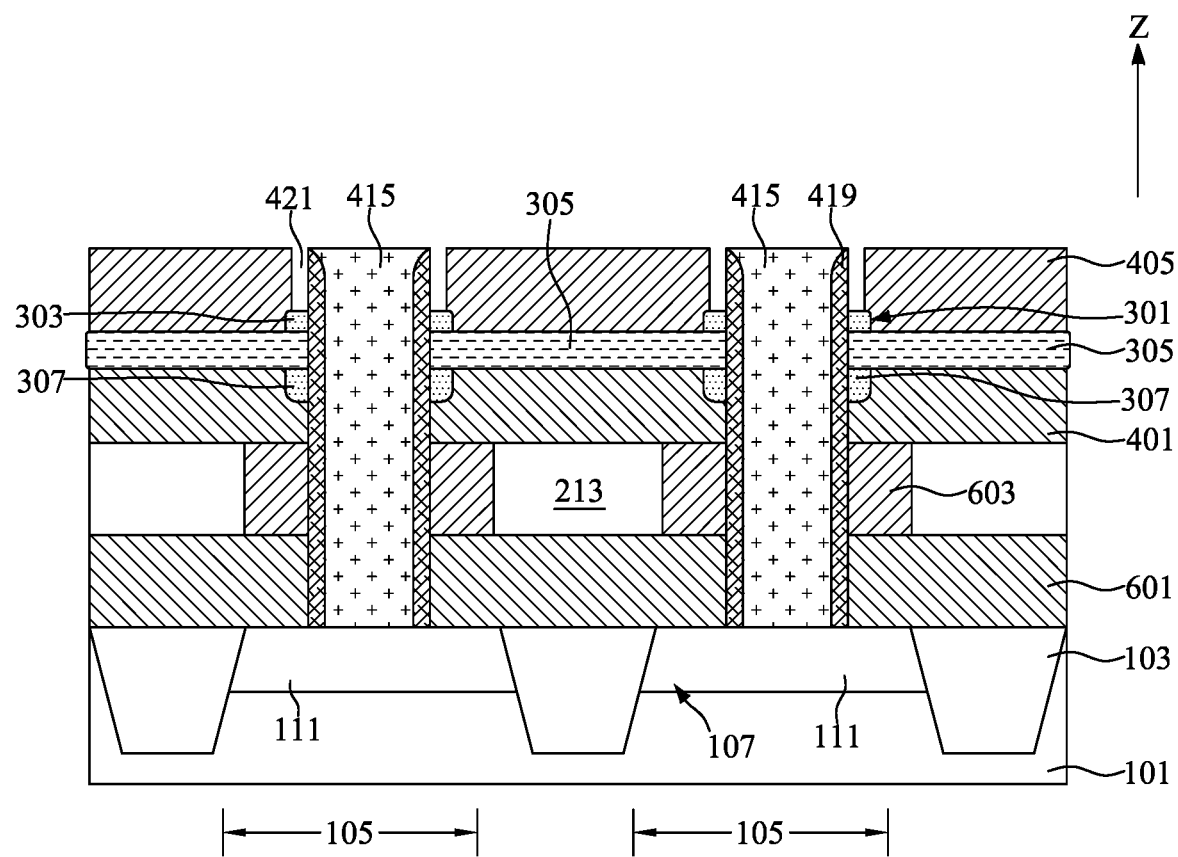
Figure 35:
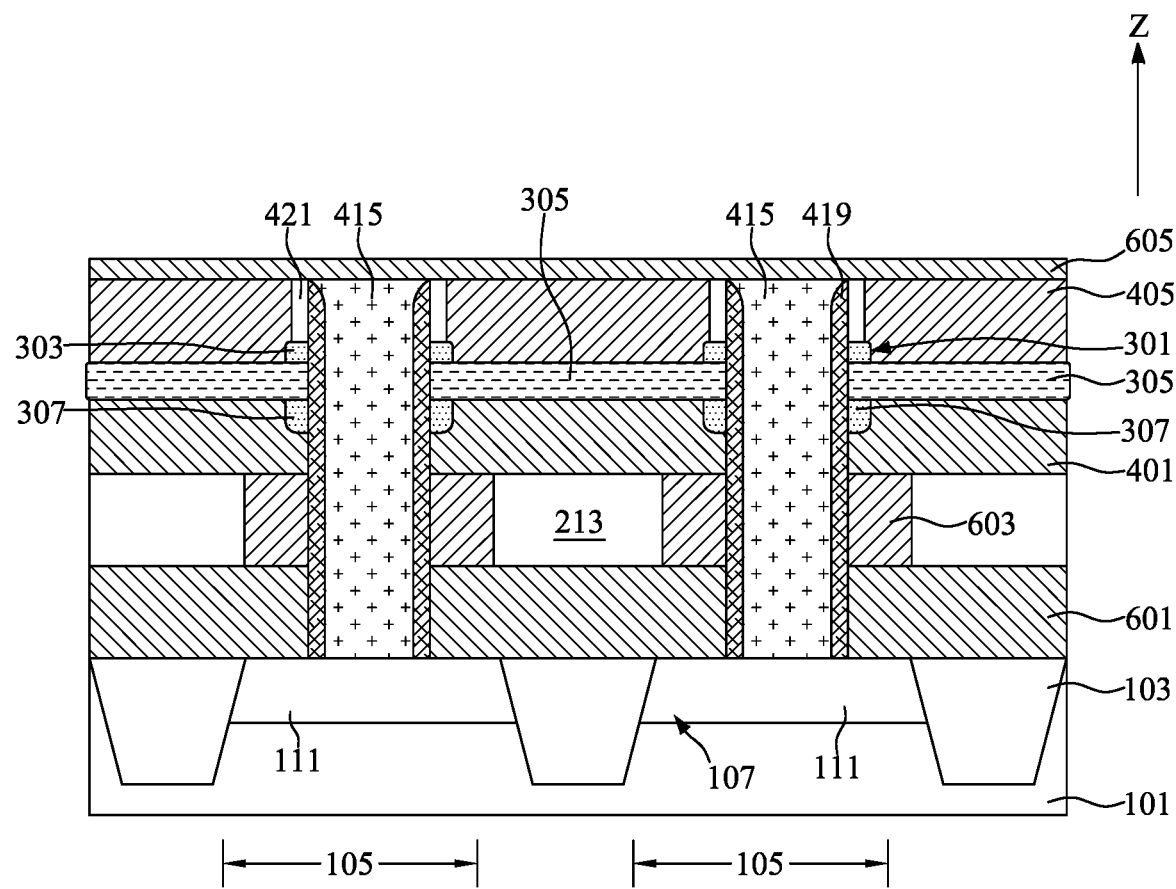

With reference to FIG. 34, in the embodiment depicted, a vapor hydrogen fluoride may be used to remove the plurality of sacrificial liners 409 to form a plurality of air gaps 421 in situ. Due to the density difference between the plurality of sacrificial liners 409 formed of doped oxide and the top insulating film 405 and the plurality of spacers 419 formed of undoped oxide, the vapor hydrogen fluoride has a greater etching rate on the plurality of sacrificial liners 409 formed of doped oxide; therefore, the plurality of sacrificial liners 409 formed of doped oxide may be removed by the vapor hydrogen fluoride, while the top insulating film 405 and plurality of spacers 419 formed of undoped oxide may remain intact. Alternatively, in another embodiment, a heat process may be performed to remove the plurality of sacrificial liners 409 formed of thermal decomposable polymer or thermal degradable polymer. A temperature of the heat process may be between about 300° C. and about 450° C. Preferably, the temperature of the heat process may be between 350° C. and about 420° C. With reference to FIG. 35, in the embodiment depicted, a sealing layer 605 may be formed on the top insulating film 405. The sealing layer 605 may cover the plurality of air gaps 421, the plurality of spacers 419, and the plurality of plugs 415.

Figure 36:
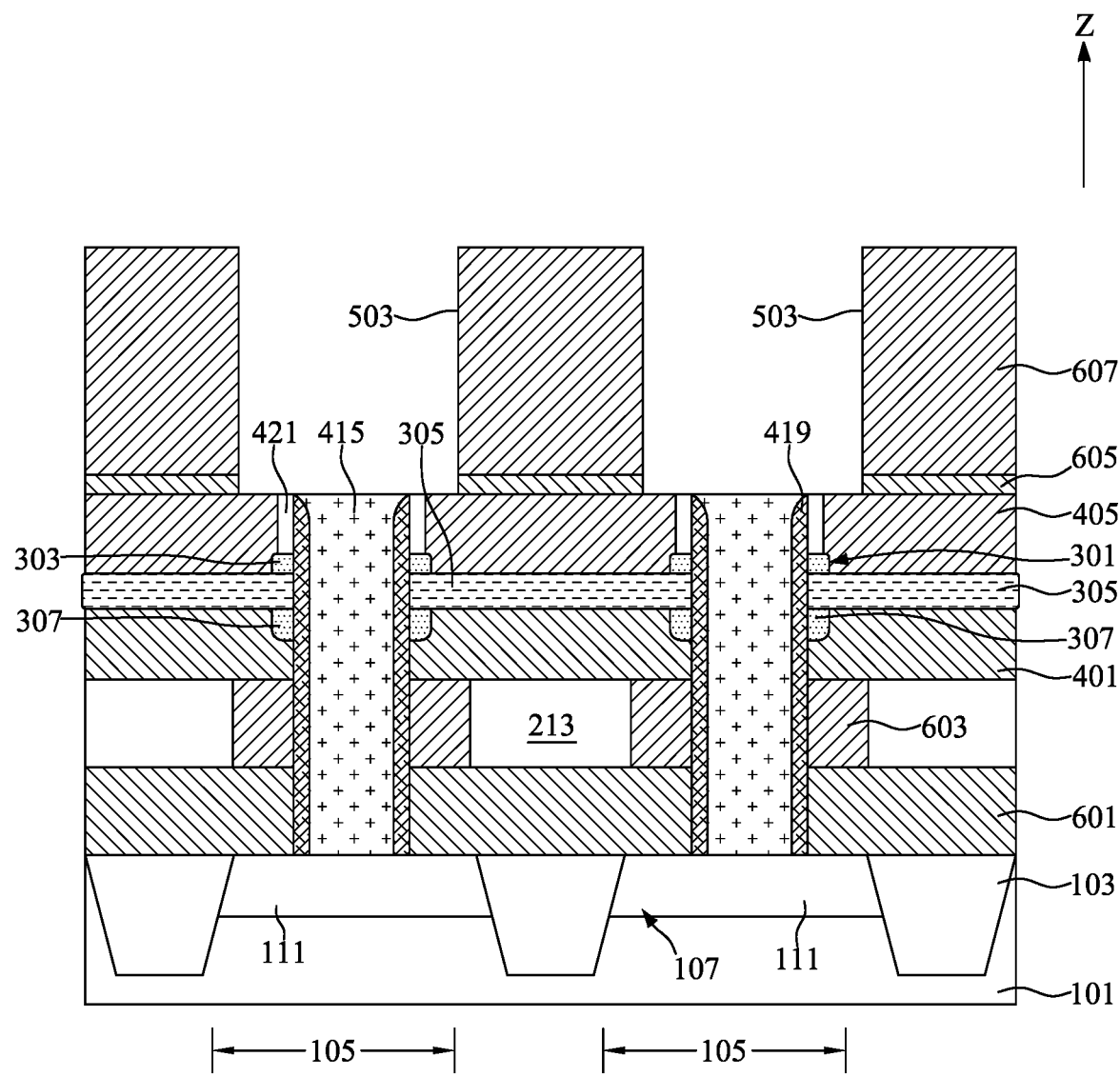
Figure 37:
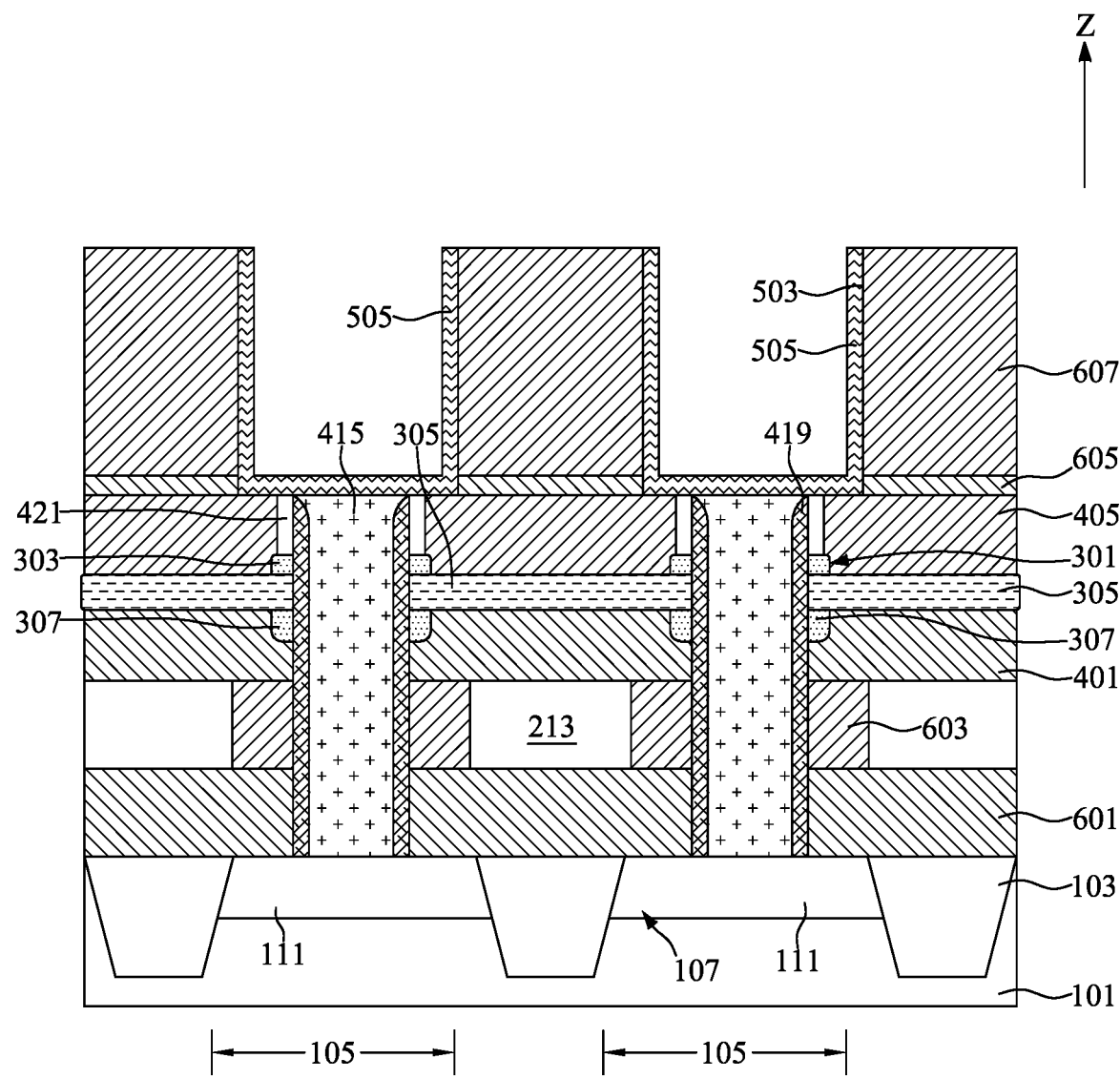
Figure 38:
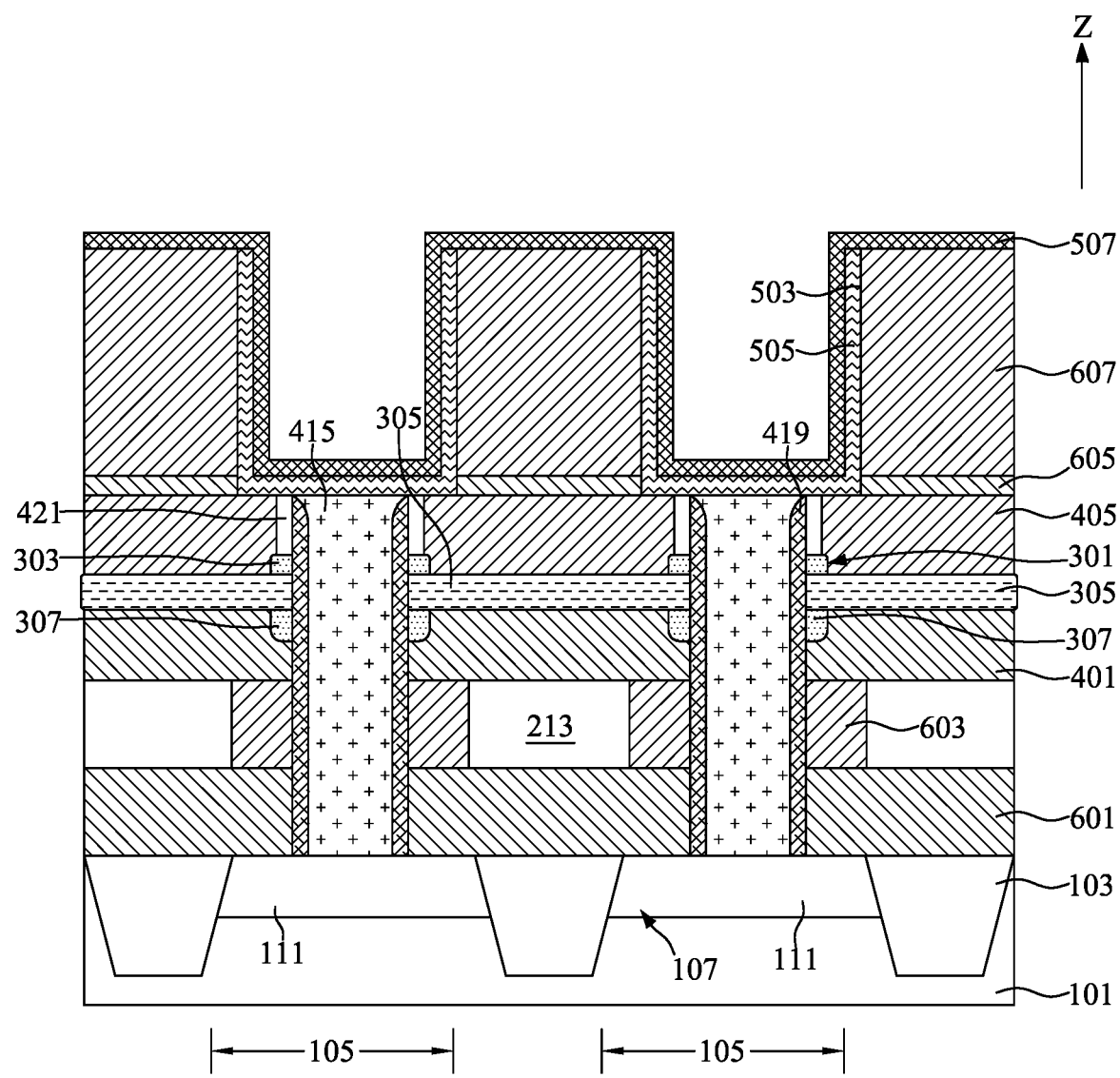

FIGS. 36 to 38 illustrate, in schematic cross-sectional diagrams, part of the flow of fabricating a semiconductor device in accordance with one embodiment of the present disclosure.

With reference to FIGS. 1 to 4 and FIGS. 36 to 38, at step S25, in the embodiment depicted, a plurality of capacitor structures 501 may be formed above the substrate 101. With reference to FIG. 36, in the embodiment depicted, a third insulating film 607 may be formed on the sealing layer 605. A photolithography process may be performed to define positions of the plurality of capacitor structures 501. After the photolithography process, an etch process, such as an anisotropic dry etch process, may be performed to form a plurality of capacitor recesses 503 penetrating through the third insulating film 607 and the sealing layer 605. The plurality of plugs 415 may be respectively correspondingly exposed through the plurality of capacitor recesses 503.

With reference to FIG. 37, in the embodiment depicted, an insulating layer may be deposited to cover the top surfaces of the third insulating film 607, sidewalls of the plurality of capacitor recesses 503, and bottoms of the plurality of capacitor recesses 503. A planarization process, such as chemical mechanical polishing, may be performed to remove part of the insulating layer covering the top surfaces of the third insulating film 607 and conformally form a plurality of capacitor bottom electrodes 505. With reference to FIG. 38, in the embodiment depicted, a capacitor insulating layer 507 may be formed on the plurality of capacitor bottom electrodes 505 in the plurality of capacitor recesses 503 and cover the top surfaces of the third insulating film 607. With reference back to FIGS. 1 to 3, in the embodiment depicted, a capacitor top electrode 509 may be formed on the capacitor insulating layer 507 and fill the plurality of capacitor recesses 503.

One aspect of the present disclosure provides a semiconductor device including a substrate, a plurality of plugs positioned above the substrate, a plurality of air gaps positioned adjacent to the plurality of plugs, and a plurality of capacitor structures positioned above the substrate.

Another aspect of the present disclosure provides a method for fabricating a semiconductor device including providing a substrate, forming a plurality of plugs above the substrate, forming a plurality of air gaps adjacent to the plurality of plugs, and forming a plurality of capacitor structures above the substrate.

Due to the design of the semiconductor device of the present disclosure, the parasitic capacitance of the semiconductor may be reduced; therefore, the performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a plurality of plugs positioned above the substrate;
a plurality of air gaps positioned adjacent to the plurality of plugs;
a plurality of capacitor structures positioned above the substrate; and
comprising a plurality of holding structures positioned adjacent to the plurality of plugs;
wherein the plurality of air gaps are positioned above the plurality of holding structures.

2. The semiconductor device of claim 1, wherein the plurality of holding structures comprise a plurality of top holding structures positioned below the plurality of air gaps, a plurality of middle holding structures positioned below the plurality of top holding structures, and a plurality of bottom holding structures positioned below the plurality of middle holding structures.

3. The semiconductor device of claim 2, further comprising a plurality of word lines, wherein the plurality of word lines extend along a first direction.

4. The semiconductor device of claim 3, wherein adjacent pairs of the plurality of middle holding structures are joined to each other along the first direction.

5. The semiconductor device of claim 4, further comprising a plurality of spacers positioned between the plurality of air gaps and the plurality of plugs.

6. The semiconductor device of claim 5, wherein the plurality of word lines comprise a plurality of word line insulating layers inwardly positioned in the substrate, a plurality of word line electrodes positioned on the plurality of word line insulating layers, and a plurality of word line capping layers positioned on the plurality of word line electrodes.

7. The semiconductor device of claim 5, further comprising a plurality of bit lines positioned above the substrate and extending along a second direction, wherein the second direction is perpendicular to the first direction.

8. The semiconductor device of claim 7, wherein the plurality of bit lines are formed as undulating strips.

9. The semiconductor device of claim 7, further comprising a plurality of bit line contacts positioned below the plurality of bit lines.

10. The semiconductor device of claim 5, wherein the plurality of capacitor structures comprise a plurality of capacitor bottom electrodes inwardly positioned above the plurality of plugs, a capacitor insulating layer positioned on the plurality of capacitor bottom electrodes, and a capacitor top electrode positioned on the capacitor insulating layer.

11. A method for fabricating a semiconductor device, comprising:
providing a substrate;
forming a plurality of plugs positioned above the substrate;
forming a plurality of air gaps positioned adjacent to the plurality of plugs;
forming a plurality of capacitor structures positioned above the substrate; and
forming a plurality of holding structures positioned adjacent to the plurality of plugs;
wherein the plurality of air gaps are positioned above the plurality of holding structures.

12. The method for fabricating the semiconductor device of claim 11, wherein the plurality of holding structures comprise a plurality of top holding structures positioned below the plurality of air gaps, a plurality of middle holding structures positioned below the plurality of top holding structures, and a plurality of bottom holding structures positioned below the plurality of middle holding structures.

13. The method for fabricating the semiconductor device of claim 12, further comprising forming a plurality of word lines positioned above the substrate, wherein the plurality of word lines extend along a first direction.

14. The method for fabricating the semiconductor device of claim 13, wherein adjacent pairs of the plurality of middle holding structures are joined to each other along the first direction.

15. The method for fabricating the semiconductor device of claim 14, further comprising a plurality of spacers positioned between the plurality of air gaps and the plurality of plugs.

16. The method for fabricating the semiconductor device of claim 15, wherein the plurality of word lines comprise a plurality of word line insulating layers inwardly positioned in the substrate, a plurality of word line electrodes positioned on the plurality of word line insulating layers, and a plurality of word line capping layers positioned on the plurality of word line electrodes.

* * * * *